(12) United States Patent
Komposch et al.

(10) Patent No.: US 11,152,325 B2
(45) Date of Patent: Oct. 19, 2021

(54) CONTACT AND DIE ATTACH METALLIZATION FOR SILICON CARBIDE BASED DEVICES AND RELATED METHODS OF SPUTTERING EUTECTIC ALLOYS

(71) Applicant: Cree, Inc., Durham, NC (US)

(72) Inventors: Alexander Komposch, Morgan Hill, CA (US); Kevin Schneider, Cary, NC (US); Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/548,241

(22) Filed: Aug. 22, 2019

(65) Prior Publication Data

US 2021/0057370 A1 Feb. 25, 2021

(51) Int. Cl.
*H01L 23/00* (2006.01)
*H01L 23/48* (2006.01)
*H01L 21/768* (2006.01)

(52) U.S. Cl.
CPC ........ *H01L 24/29* (2013.01); *H01L 21/76898* (2013.01); *H01L 23/481* (2013.01); *H01L 24/05* (2013.01); *H01L 24/27* (2013.01); *H01L 2224/02372* (2013.01); *H01L 2224/02381* (2013.01); *H01L 2224/05569* (2013.01); *H01L 2224/2745* (2013.01); *H01L 2224/29025* (2013.01); *H01L 2224/29084* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29166* (2013.01);
(Continued)

(58) Field of Classification Search
CPC ........ H01L 23/481; H01L 24/05; H01L 24/27
See application file for complete search history.

(56) References Cited

U.S. PATENT DOCUMENTS 6,136,693 A * 10/2000 Chan ................. C23C 14/588
204/192.15
6,825,559 B2 11/2004 Mishra et al.
(Continued)

FOREIGN PATENT DOCUMENTS

CA 2511005 C 5/2016
CN 1757119 B 2/2011
(Continued)

*Primary Examiner* — Peniel M Gumedzoe
(74) *Attorney, Agent, or Firm* — Myers Bigel, P.A.

(57) ABSTRACT

A semiconductor device package includes a package substrate having a die attach region, a silicon carbide (SiC) substrate having a first surface including a semiconductor device layer thereon and a second surface that is opposite the first surface, and a die attach metal stack. The die attach metal stack includes a sputtered die attach material layer that attaches the second surface of the SiC substrate to the die attach region of the package substrate, where the sputtered die attach material layer comprises a void percent of about 15% or less. The sputtered die attach material layer may be formed using a sputter gas including at least one of krypton (Kr), xenon (Xe), or radon (Rn). The die attach metal stack may further include a metal interlayer that prevent contacts with a first barrier metal layer during a phase transition of the die attach material layer.

17 Claims, 15 Drawing Sheets

(52) U.S. Cl.
CPC ............... *H01L 2224/29169* (2013.01); *H01L 2224/29184* (2013.01); *H01L 2924/10272* (2013.01); *H01L 2924/13064* (2013.01); *H01L 2924/13091* (2013.01)

(56) References Cited

U.S. PATENT DOCUMENTS

| | | |
|---|---|---|
| 7,354,782 B2 | 4/2008 | Mishra et al. |
| 7,851,909 B2 | 12/2010 | Mishra et al. |
| 8,274,159 B2 | 9/2012 | Mishra et al. |
| 8,803,313 B2 | 8/2014 | Mishra et al. |
| 8,970,010 B2 | 3/2015 | Radulescu et al. |
| 9,226,383 B2 | 12/2015 | Mishra et al. |
| 9,490,169 B2 | 11/2016 | Ring et al. |
| 2003/0227092 A1* | 12/2003 | Liu .................... H01L 21/76804 257/774 |
| 2009/0220777 A1 | 9/2009 | Sporn |
| 2009/0273093 A1* | 11/2009 | Lypen .................... H01L 23/544 257/774 |
| 2011/0115025 A1* | 5/2011 | Okamoto ............ H01L 29/4175 257/368 |
| 2012/0012376 A1* | 1/2012 | Li ......................... H05K 3/3452 174/261 |
| 2015/0294921 A1* | 10/2015 | Viswanathan ........ H01L 23/481 257/76 |
| 2019/0140598 A1* | 5/2019 | Schultz ................ H04B 1/0458 |

FOREIGN PATENT DOCUMENTS

| | | |
|---|---|---|
| EP | 2518764 A2 | 10/2012 |
| JP | 4830092 B2 | 9/2011 |
| KR | 101288153 B1 | 7/2013 |
| KR | 101371907 B1 | 3/2014 |
| TW | I333278 B | 11/2010 |
| WO | 01/73153 A1 | 10/2001 |
| WO | 2004061973 A1 | 7/2004 |

* cited by examiner

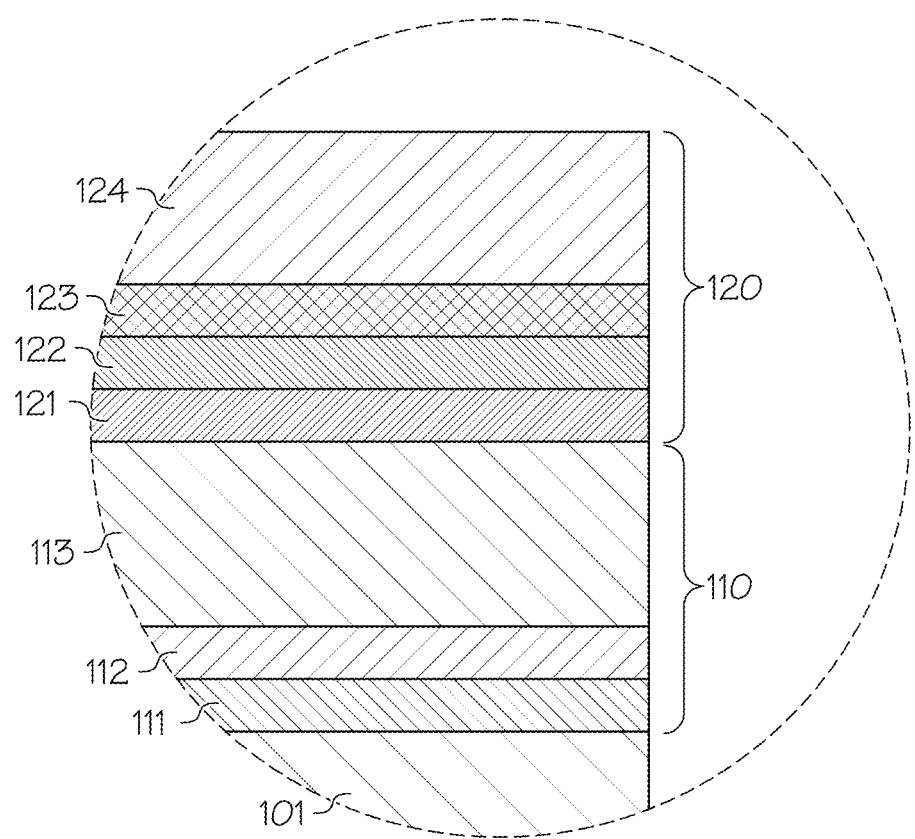
FIG. 1A1

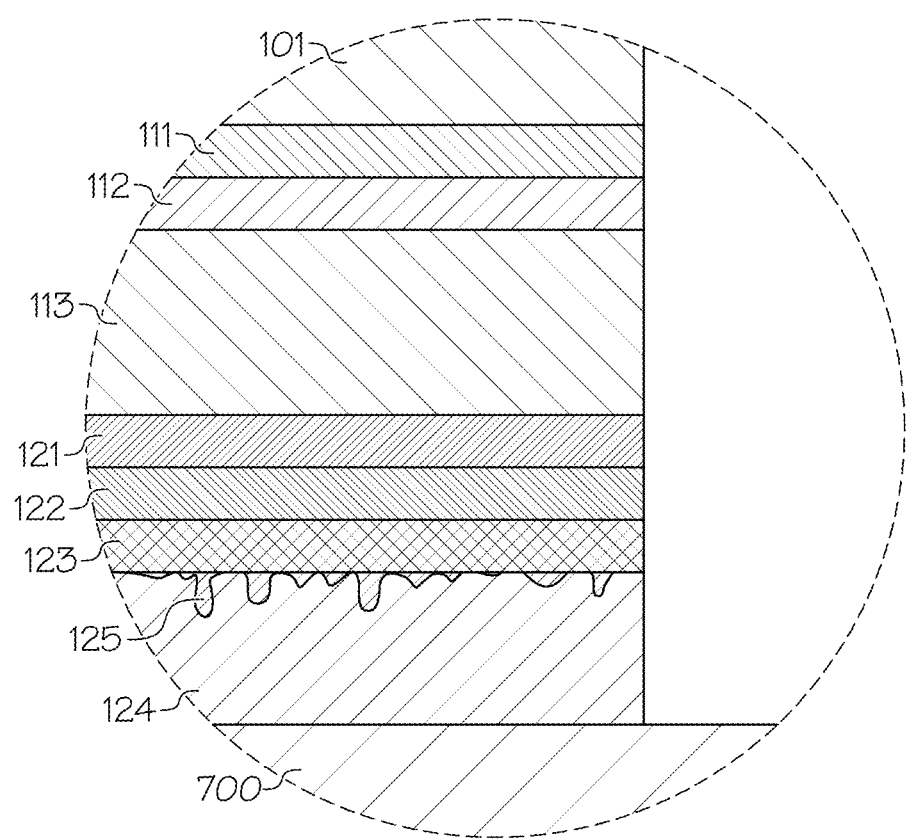
FIG. 7A1

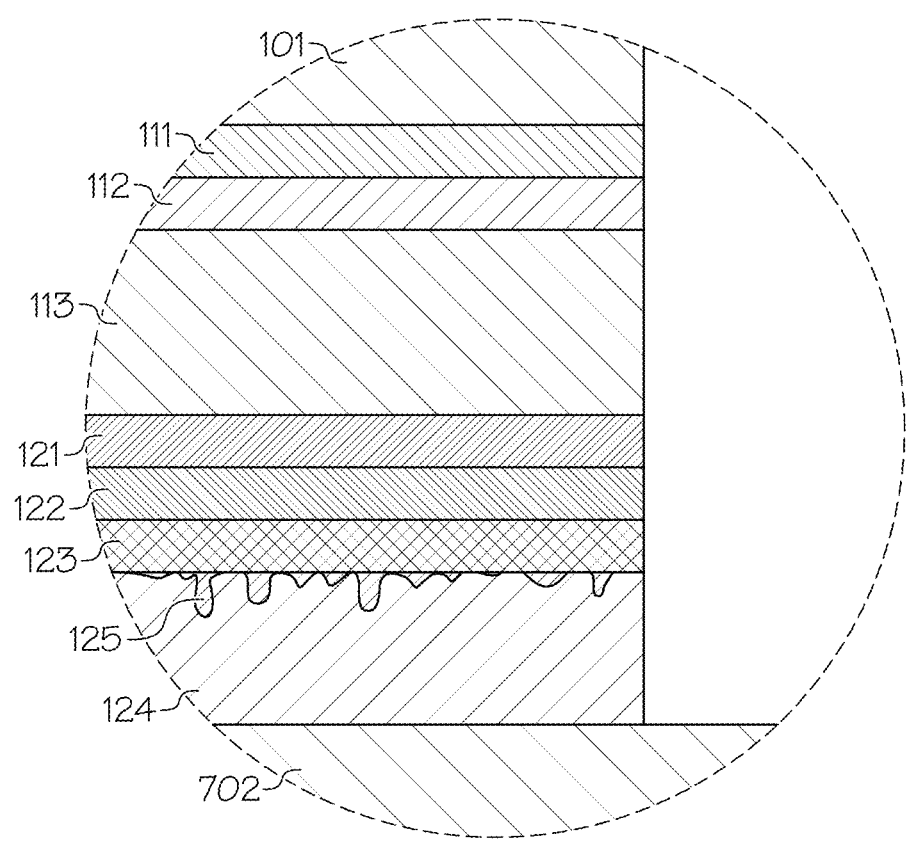
FIG. 7B1

CONTACT AND DIE ATTACH METALLIZATION FOR SILICON CARBIDE BASED DEVICES AND RELATED METHODS OF SPUTTERING EUTECTIC ALLOYS

FIELD

The present disclosure relates to die attach metallization and related deposition methods for semiconductor devices.

BACKGROUND

Advances in semiconductor electronics have increased the availability of wide-bandgap materials, such as silicon carbide (SiC), gallium arsenide (GaAs), and Group III nitride-based materials (e.g., GaN, AlGaN, InGaN). The wide bandgap characteristics of silicon carbide and the Group III nitrides can allow for improved performance of semiconductor electronics at higher frequencies and power levels that traditional materials may not withstand, providing opportunities for development of high frequency, high power semiconductor electronic devices.

Vias may be used to interconnect backside and frontside metallization in high frequency, high power semiconductor devices such as radio or microwave frequency devices or power devices. Frontside metallization may refer to one or more metal layers on a "front" side or surface of a semiconductor structure that includes the semiconductor device layer and contacts to one or more semiconductor devices formed in and/or on the semiconductor device layer, such as a source contact pad, a gate contact pad, and a drain contact pad. Backside metallization may refer to one or more metal layers on a "back" side or surface of a semiconductor structure, which is opposite to the semiconductor device layer.

Examples of semiconductor devices may include, but are not limited to, light emitting diodes (LEDs), High Electron Mobility Transistors (HEMTs), Field Effect Transistors (FETs), Metal-Oxide-Semiconductor Field Effect Transistors (MOSFETs), and Schottky diodes. These semiconductor devices may have vertical or lateral device structures. Using a lateral HEMT as an example, the HEMT includes a semiconductor structure that, in one example implementation, includes a substrate (e.g., a SiC, silicon (Si), or sapphire substrate), and a semiconductor base or channel layer (e.g., a Gallium Nitride (GaN) layer) on the substrate, and a barrier layer (e.g., an Aluminum Gallium Nitride (AlGaN) layer) on the base layer. In order to carry large currents and to dissipate heat, some HEMTs may also include a backside metallization that is electrically and thermally connected to the source contact by a conductive via that extends from the backside of the semiconductor device structure to the frontside metallization of the semiconductor structure, also referred to as a through-substrate via.

Si-based devices may require robust metallization schemes to allow for device operational electrical loads, facilitate die attach, and provide resistance to mechanical/electrical degradation over time and/or under stress, particularly for attachment to package substrates having differences in coefficient of thermal expansion (CTE) relative to SiC.

SUMMARY

According to some embodiments, a method of fabricating a semiconductor device includes providing a silicon carbide (SiC) substrate having a first surface including a semiconductor device layer thereon and a second surface that is opposite the first surface, and performing a sputtering process to deposit a die attach material layer on the second surface of the SiC substrate using a sputter gas comprising at least one of krypton (Kr), xenon (Xe), or radon (Rn).

In some embodiments, the method further includes performing a die attach operation comprising a phase transition of the die attach material layer to attach the second surface of the SiC substrate to a surface of a package substrate. Responsive to the phase transition, the die attach material layer may have a void percent of about 15% or less. In some embodiments, a contact area between the die attach material layer and the surface of the package substrate is greater than about one square millimeter.

In some embodiments, a first barrier metal layer is formed on the second surface of the SiC substrate, and a metal interlayer is formed on the first barrier metal layer. Performing the sputtering process may deposit the die attach material layer on the metal interlayer, and the metal interlayer may react with the die attach material layer to prevent contact between the die attach material layer and the first barrier metal layer during the phase transition.

In some embodiments, the die attach material layer comprises a eutectic or near eutectic alloy. The metal interlayer may increase a melting point of the eutectic or near eutectic alloy by forming an alloy of the die attach material layer and the metal interlayer along an interface therebetween during the phase transition.

In some embodiments, the metal interlayer comprises at least one of nickel (Ni), silver (Ag), palladium (Pd), or copper (Cu).

In some embodiments, the die attach material layer comprises gold (Au), and wherein the surface of the package substrate comprises copper (Cu).

In some embodiments, a contact metal stack is formed on the second surface of the SiC substrate prior to the sputtering process. Forming the contact metal stack may include forming a metal adhesion layer on the second surface of the SiC substrate, forming a second barrier metal layer on the adhesion layer, and plating a contact metal layer on the second barrier metal layer.

In some embodiments, at least one contact is formed on the semiconductor device layer opposite the SiC substrate, and a via opening is formed in the second surface. The via opening may extend through the SiC substrate and toward the at least one contact. Performing the sputtering process may conformally deposit the die attach material layer on the metal interlayer along the second surface of the SiC substrate and within the via along sidewall surfaces thereof such that the via is unfilled.

In some embodiments, a concentration of the at least one of Kr, Xe, or Rn in the sputter gas is greater than about 50 percent, or greater than about 75 percent.

In some embodiments, the sputter gas comprises argon (Ar), and a concentration of the Ar in the sputter gas is less than about 50 percent, or less than about 25 percent.

In some embodiments, prior to the phase transition, the die attach material layer comprises at least one of Kr, Xe, or Rn atoms therein, based on the concentration of the at least one of Kr, Xe, or Rn in the sputter gas, respectively. Responsive to the phase transition, the void percent of the die attach material layer may be about 10% or less, or about 5% or less.

According to some embodiments, a semiconductor device package includes a package substrate comprising a die attach region, a silicon carbide (SiC) substrate having a first surface including a semiconductor device layer thereon and a second surface that is opposite the first surface, and a die attach metal stack comprising a sputtered die attach material layer that attaches the second surface of the SiC substrate to the die attach region of the package substrate. The sputtered die attach material layer comprises a void percent of about 15% or less.

In some embodiments, a contact area between the sputtered die attach material layer and the die attach region of the package substrate is greater than about one square millimeter.

In some embodiments, the die attach metal stack further includes a first barrier metal layer on the second surface of the SiC substrate, and a metal interlayer between the first barrier metal layer and the sputtered die attach material layer. The metal interlayer may be configured to react with the sputtered die attach material layer to prevent contact between the first barrier metal layer and the sputtered die attach material layer during a phase transition thereof.

In some embodiments, the die attach material layer comprises a eutectic or near eutectic alloy, and the metal interlayer is configured to increase a melting point of the eutectic or near eutectic alloy by forming an alloy of the die attach material layer and the metal interlayer along an interface therebetween.

In some embodiments, a contact metal stack is provided between the die attach metal stack and the second surface of the SiC substrate. The contact metal stack may include a metal adhesion layer on the second surface of the SiC substrate, a second barrier metal layer on the metal adhesion layer, and a contact metal layer on the second barrier metal layer.

In some embodiments, at least one contact is provided on the semiconductor device layer opposite the SiC substrate, and at least one via extends through the SiC substrate from the second surface thereof toward the at least one contact. The die attach metal stack and the contact metal stack may conformally extend along the second surface of the SiC substrate and within the via along sidewall surfaces thereof such that the via is unfilled.

According to some embodiments, a semiconductor device package includes a package substrate comprising a die attach region, a silicon carbide (SiC) substrate having a first surface including a semiconductor device layer thereon and a second surface that is opposite the first surface, and a die attach metal stack that attaches the second surface of the SiC substrate to the die attach region of the package substrate. The die attach metal stack includes a first barrier metal layer, a die attach material layer, and a metal interlayer therebetween that is configured to react with the die attach material layer during a phase transition thereof.

In some embodiments, the die attach material layer comprises a eutectic or near eutectic alloy, and the metal interlayer is configured to increase a melting point of the eutectic or near eutectic alloy by forming an alloy of the die attach material layer and the metal interlayer along an interface therebetween.

In some embodiments, the die attach material layer comprises a sputtered layer having a void percent of about 15 or less, and a contact area between the die attach material layer and the die attach region of the package substrate is greater than about one square millimeter.

In some embodiments, the die attach metal stack further comprises a first adhesion layer between the first barrier metal layer and the second surface of the SiC substrate. A contact metal stack may be provided between the die attach metal stack and the second surface of the SiC substrate. The contact metal stack may include a second adhesion layer on the second surface of the SiC substrate, a second barrier metal layer on the second adhesion layer, and a contact metal layer on the second barrier metal layer. The second adhesion layer may include titanium (Ti) or alloy thereof, the second barrier metal layer may include Ti and/or tungsten (W) or alloys thereof, the contact metal layer may include Au or alloy thereof, and a thickness of the contact metal layer may be greater than a thickness of the die attach material layer.

In some embodiments, at least one contact is provided on the semiconductor device layer opposite the SiC substrate, and at least one via extends through the SiC substrate from the second surface thereof toward the at least one contact. The contact metal stack and the die attach metal stack may conformally extend from the second surface of the SiC substrate and within the via along sidewall surfaces thereof such that the via is unfilled.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 1A is a schematic cross-sectional view of a semiconductor device including metallization stacks according to some embodiments of the present disclosure and FIG. 1A1 is an enlarged view of a portion of FIG. 1A.

FIG. 7A is a schematic cross-sectional view of a semiconductor device including metallization stacks after die attach to a package substrate according to some embodiments of the present disclosure and FIG. 7A1 is an enlarged view of a portion of FIG. 7A.

FIG. 7B is a schematic cross-sectional view of a semiconductor device including metallization stacks after flux-based die attach to a package substrate according to some embodiments of the present disclosure and FIG. 7B1 is an enlarged view of a portion of FIG. 7B.

DETAILED DESCRIPTION

Figure 1A:
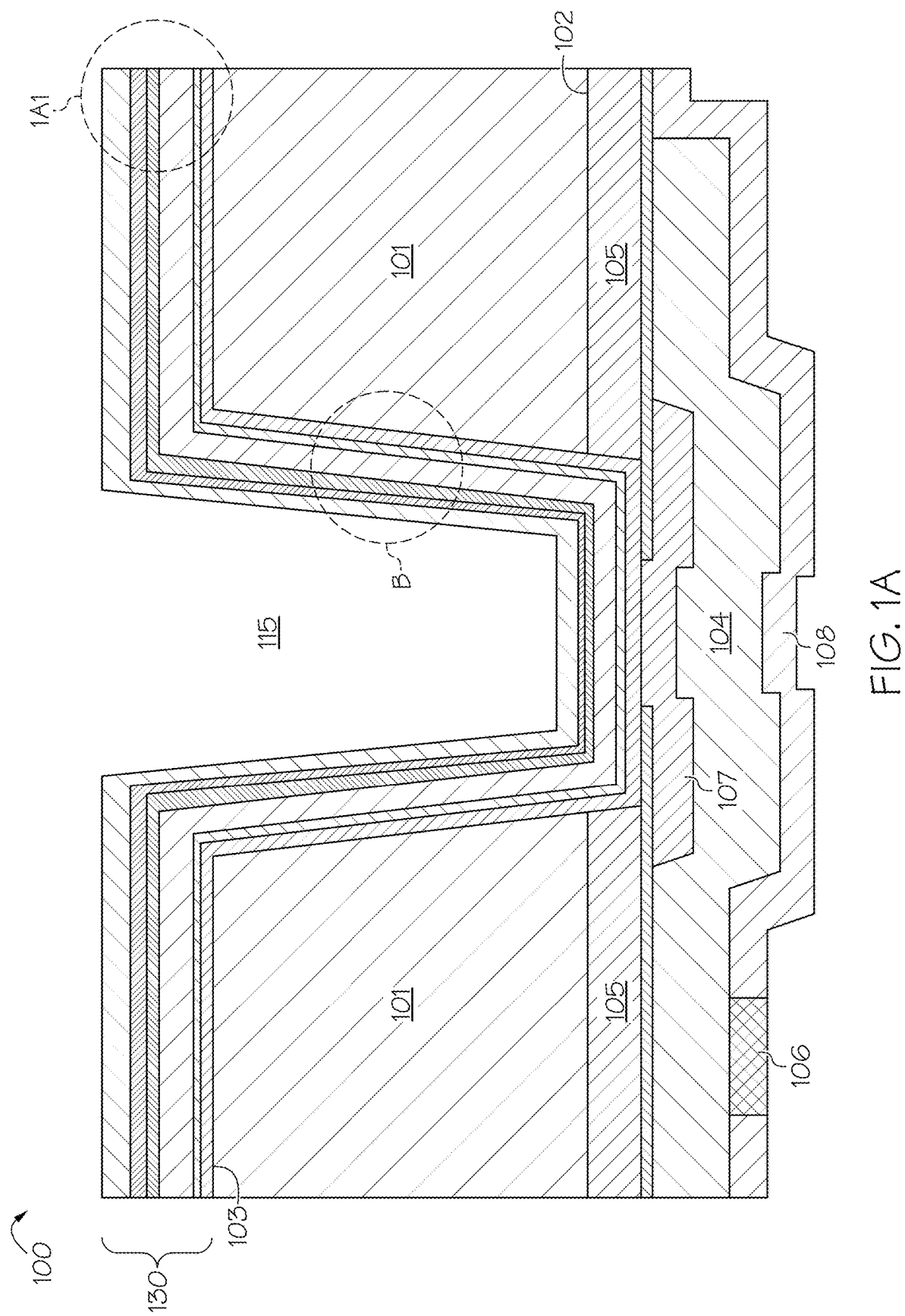
Figure 1B:
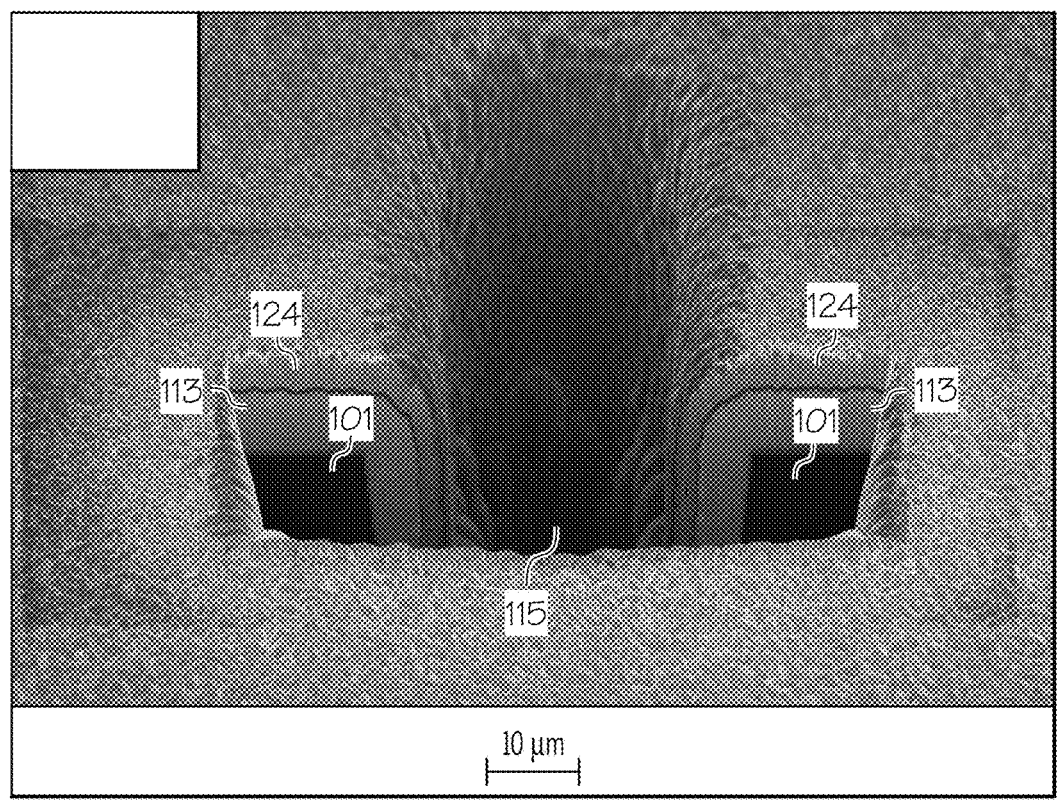
FIGS. 1B, 1C, and 1D are successively enlarged focused ion beam (FIB) cross-sectional SEM images of a semiconductor device including metallization stacks according to some embodiments of the present disclosure.
Figure 1C:
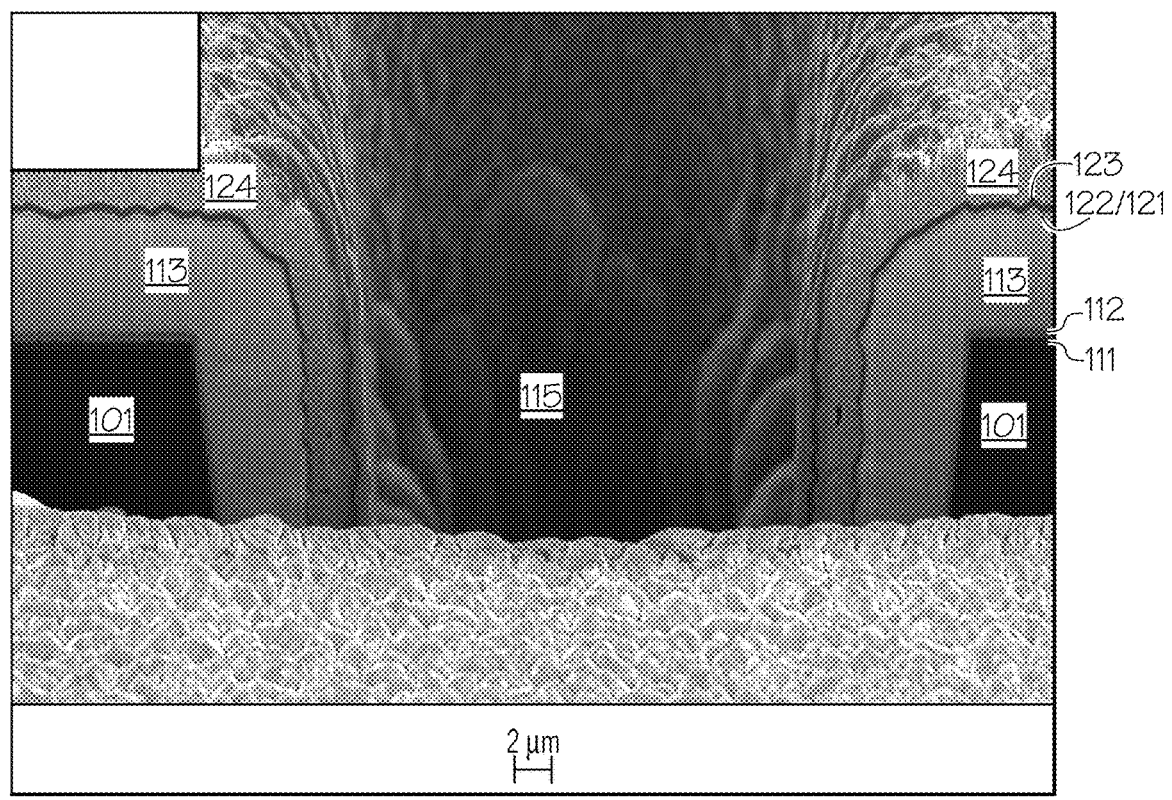
Figure 1D:
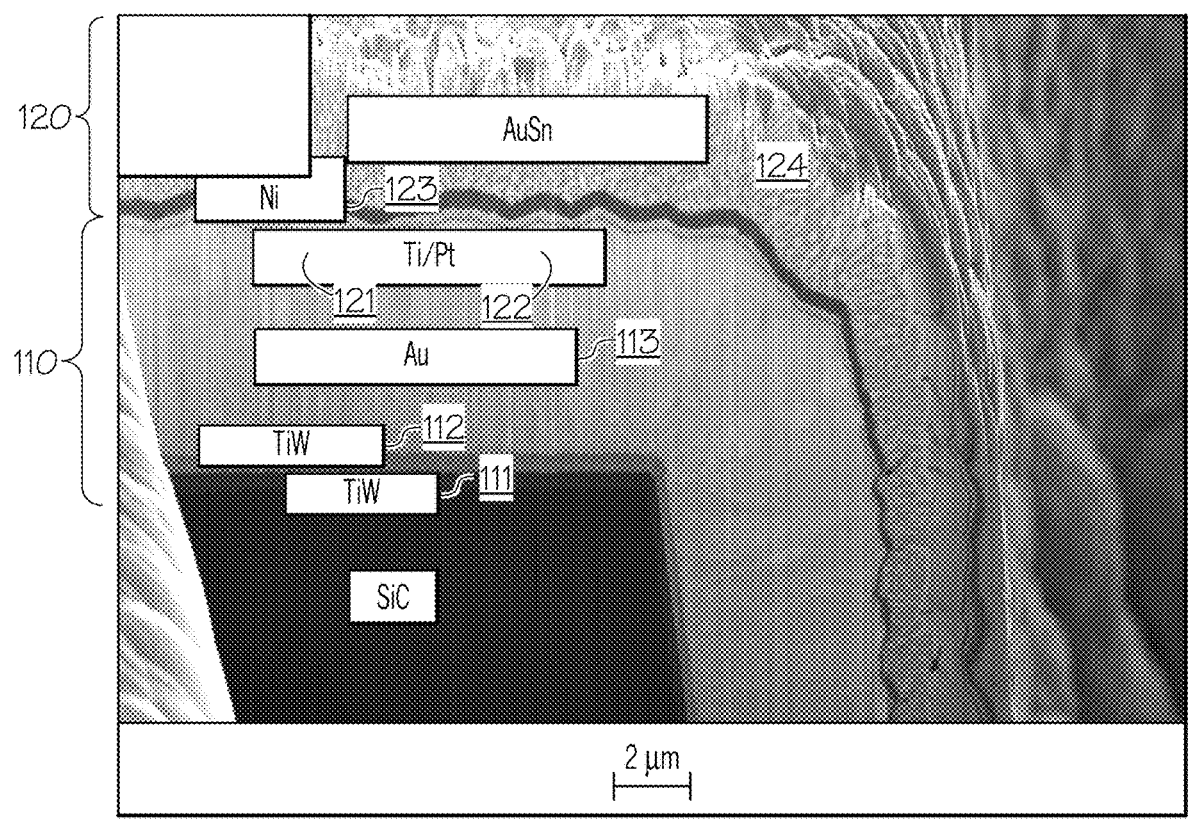

Embodiments of the present disclosure are directed to metallization schemes and related fabrication methods for RF and/or power semiconductor devices (such as GaN on SiC devices), which may include through-via electrical contacts to provide improved device performance and reliability. In particular, methods and devices described herein can facilitate die attach of SiC devices (including, in some embodiments, devices having through-vias) while maintaining useful barrier metal layers that can prevent contamination of or solder metal diffusion into the device and/or electrical contacts.

Die attach may refer to operations that result in electrical and thermal connection between a semiconductor device layer on a substrate (collectively referred to as a die) and a package or packaging substrate (typically of a different material than the die). Die attach operations typically occur after the dicing or sawing of a semiconductor wafer into individual die. Some die attach operations may involve the attachment of the semiconductor die to a metal die attach region or flange of the package substrate by way of a solderable die attach material. During solder-based die attach, the die attach material may be deposited on a surface of the die (e.g., on the backside surface, including on any contact metal layer(s) thereon), and the die and the die attach region are subjected to temperatures that are sufficiently high (e.g., greater than about 220° C.) to effect reflow of the die attach material, that is, a phase transition of the die attach material from a solid phase to a liquid phase.

Some embodiments may arise from realization that, in die attach operations for devices having larger die sizes (e.g., RF and/or power semiconductor devices having die attachment surface areas of greater than about one square millimeter), outgassing of deposition byproducts during the phase transition of the die attach material may result in the formation of voids in the die attach material. Such deposition byproducts may include, for example, element(s) of a sputter gas that may be incorporated in the die attach material during a sputter deposition process (also referred to herein as sputtering). The thickness of the die attach material layer and/or processing times and/or temperatures may further contribute to void formation, which can result in poor thermal performance, delamination, or other failure in the die attach process.

For example, when sputtering gold-tin (AuSn) as a solderable die attach material for backside metallization using an argon (Ar) sputtering gas, Ar atoms may be incorporated into the backside metallization, which subsequently creates intrinsic voiding when the AuSn layer transitions from solid to liquid phase during the die attach process. The incorporation of Ar into the backside metallization may be due to the low mass ratio of Ar to Au (in AuSn) atoms, as the reflection rate (R) of the Ar atoms may be high (neutralization of energetic gas ions before cathode collision (target) may be reflected with high energy), resulting in highly accelerated Ar atoms bombarding the wafer side during sputter deposition.

The contamination of the AuSn or other sputtered die attach material layer with Ar or other sputtering gas contaminants may result in increased substrate temperatures, coarser grain structure of the deposited die attach material layer, and/or a slower deposition rate. The present inventors have further recognized that such contaminants may be problematic in post-sputtering operations, for example, causing void formation and/or related delamination issues in post-sputtering die attach operations.

In particular, when an AuSn layer transitions from a solid state to a (semi) liquid state during a die attach operation, outgassing of the Ar atoms trapped in the AuSn layer during the sputter deposition process may occur, resulting in the formation of voids in the AuSn die attach material layer. This may be particularly problematic in devices having larger die attachment surface areas and/or greater die attach material layer thicknesses, as more sputter gas atoms or particles may be incorporated as contaminants into the die attach material layer over the larger area and/or thickness. Also, the effective length to the die edge during die attach may be longer with larger surface areas, which may make it more difficult for trapped/incorporated gas in the die attach metals to escape during the die attach and thus increase the likelihood of bonding void formation. Processing conditions of such larger dies, including faster temperature ramps and/or more immediate or direct attachment to packaging, may further increase void formation due to sputter gas contamination. The amount and concentration of voids in the die attach material layer may reduce the thermal conductivity and/or bonding strength thereof, which may negatively affect device performance, yield, and/or reliability.

To reduce or avoid incorporation of Ar into the metallization during the sputter deposition process, some embodiments described herein are directed to sputtering operations where the sputter gas includes noble gases that are heavier than Ar (for example, Krypton (Kr), Xenon (Xe), and/or Radon(Rn)). It will be understood that a sputter gas described herein as comprising or including or using a particular element includes an amount of the element that is measurably or substantially greater than atmospheric or otherwise naturally occurring amounts of the element. The use of sputter gases comprising one or more of such heavier noble gases, in some embodiments as a mixture in combination with Ar, may reduce incorporation of noble gas(es) from the sputter deposition process into the die attach material layer, and thus, may reduce formation of voids in the deposited die attach material layer and/or other problems that may be encountered in post-sputtering processes.

Die attach material layers formed in accordance with embodiments of the present disclosure may have fewer voids per die, described herein in terms of a void percent, which refers to the projected area of voids relative to void-free area over the die attach area. That is, void percent (or void %) may refer to the accumulated areas of voids over the footprint of the die attach area. The projected or plan view area of the die attach area (and the void percent over the die attach area) may be determined herein with reference to acoustic microscopy techniques, in particular, C-SAM (C-mode Scanning Acoustic Microscopy). For example, die attach material layers (such as AuSn or other low-melting alloys) formed in accordance with some embodiments of the present disclosure may have a void percent of less than about 25%, less than about 15%, less than about 10%, less than about 5%, or less than about 3%, depending on the concentration of Ar in the sputtering gas. The reduced concentration of voids in the die attach material layers may be critical to increasing the strength and/or thermal reliability of the bond interface and reducing the likelihood of delamination from a die attach region (also referred to herein as a flange) of a package substrate, particularly for die and package substrate materials with differences in coefficients of thermal expansion (CTE), such as for attachment of SiC-based dies to copper (Cu)-based packages. Embodiments of the present disclosure may thereby improve yields and reliability in SiC-based devices including radio frequency (RF), power, and LED devices. Examples of such semiconductor devices may include Schottky diodes, RF power transistor devices, e.g., HEMTs and/or power MOSFETs (metal oxide semiconductor field effect transistor) such as LDMOS (laterally diffused metal oxide semiconductor) devices.

FIG. 1A is a schematic cross-sectional view, FIG. 1A1 is an enlarged view of a portion of FIG. 1A, and FIGS. 1B, 1C, and 1D are successively enlarged cross-sectional images of a semiconductor device including metallization stacks according to some embodiments of the present disclosure. As shown in FIGS. 1A-1D, a semiconductor structure 100 includes a semiconductor device layer 105 on a front-side surface 102 of a substrate 101. The semiconductor device layer 105 may include wide-bandgap semiconductor materials, such as SiC and/or Group III nitride-based materials, which may be formed as one or more epitaxial layers on the substrate 101, described primarily herein with reference to SiC substrates by way of example. The use of a substrate and epitaxial layer(s), which in some embodiments may be the same material, may result in improved crystal lattice in the epitaxial layers as compared to the substrate. In some embodiments, the semiconductor device layer 105 may include one or more layers of semiconductor material other than SiC (such as Group III nitride-based layers) formed on a SiC or other substrate. The Group III nitride layers may define the channel regions of transistor devices in the semiconductor device layer 105, for example, field effect transistors (FETs) or high electron mobility transistors (HEMTs). The substrate 101 including the semiconductor device layer 105 thereon may be collectively referred to as a die 100.

The semiconductor structure 100 further includes a metallization stack 130 on the backside surface 103 of the substrate 101. This backside metallization stack 130 includes a contact metal stack 110 and a die attach metal stack 120, with portions on the backside surface 103 as well as around the periphery of and within a through substrate via 115 that extends from the backside surface 103 to the frontside surface 102 through the substrate 101 and the semiconductor device layer 105. The bottom surface of the via 115 is adjacent the frontside surface 102, such that the via 115 may provide electrical contact with frontside metallization. For example, the frontside surface 102 may include a metal layer 104 thereon, which provides contact(s) between one or more devices in the semiconductor device layer 105 and respective pads 106. In some embodiments, the metal layer 104 may be referred to as a "Metal 1" (M1) metallization layer that provides a source contact to the source region of a transistor formed in the semiconductor device layer 105. The frontside surface 102 may also include an additional interconnect layer 107 and associated electrical passivation layers 108 thereon.

The contact metal stack 110 on the backside surface 103 of the substrate 101 includes one or more layers 111, 112, and 113 of the same or different metals or metal alloys that are selected and formed to provide improved device performance. For example, the contact metal stack 110 may include an adhesion layer 111, a barrier metal layer 112, and a contact metal layer 113. The adhesion layer 111 may include one or more materials, alloys, and/or layers configured to promote adhesion with the surface 103 of the substrate 101. In some embodiments, the adhesion layer 111 may include titanium (Ti). The barrier metal layer 112 may include one or more materials, alloys, and/or layers configured to prevent migration of the material(s) of the contact metal layer 113 into the substrate 101. In some embodiments, the barrier metal layer 112 may include titanium tungsten (TiW) or alternating layers of TiW and platinum (Pt). More generally, possible barrier metal layer materials may include Ti, TiW, Pt, Cr, including multiple and/or alternating layers thereof. The contact metal layer 113 may include one or more materials, alloys, and/or layers configured to provide desired device performance characteristics, such as low electrical resistance and high electrical current capacity or carrying capability. In some embodiments, the contact metal layer 113 may include gold (Au) having a thickness of between about 1 micron (μm) to about 15 μm. For example, the contact metal stack 110 may include a 0.5 μm (±0.25 μm) Ti adhesion layer 111, a 0.5 μm (±0.25 μm) TiW barrier metal layer 112, and a 6 μm (±2 μm) Au contact metal layer 113 on a backside surface 103 of a SiC substrate 101. The various layers of the stacks described herein may be continuous or discontinuous in some embodiments.

In embodiments including the via 115, the contact metal stack 110 may be conformally formed on the surface 103 of the substrate 101 as well as along sidewall and bottom surfaces of the via 115. The thickness of one or more layers 111, 112, and 113 of the contact metal stack 110 on the surface 103 of the substrate 101 (portion "1A1" in FIG. 1A) may differ from the thickness of one or more layers 111, 112, and 113 of the contact metal stack 110 on the sidewalls (portion "B" in FIG. 1A) and/or bottom surface of the via 115. For example, the Au contact metal layer 113 may deposited (e.g., using an electroplating process) to a thickness of about 6 μm on the surface 103, but may have a thickness of only about 2 μm at the bottom surface of the via 115, and may have a thickness on sidewall surfaces of the via 115 that is lesser or greater than thickness on the bottom surface of the via 115 (but no greater than the thickness on the surface 103 of the substrate 101). The Ti/TiW layers 111/112 may serve as electromigration and diffusion barriers. It will be understood that embodiments are described herein with reference to fabrication and attachment of embodiments of devices including vias 115 by way of example only, and devices and related fabrication and attachment processes described herein may be applied to devices without vias 115, and are in no way limited to devices having through-substrate vias 115.

Figure 7A:
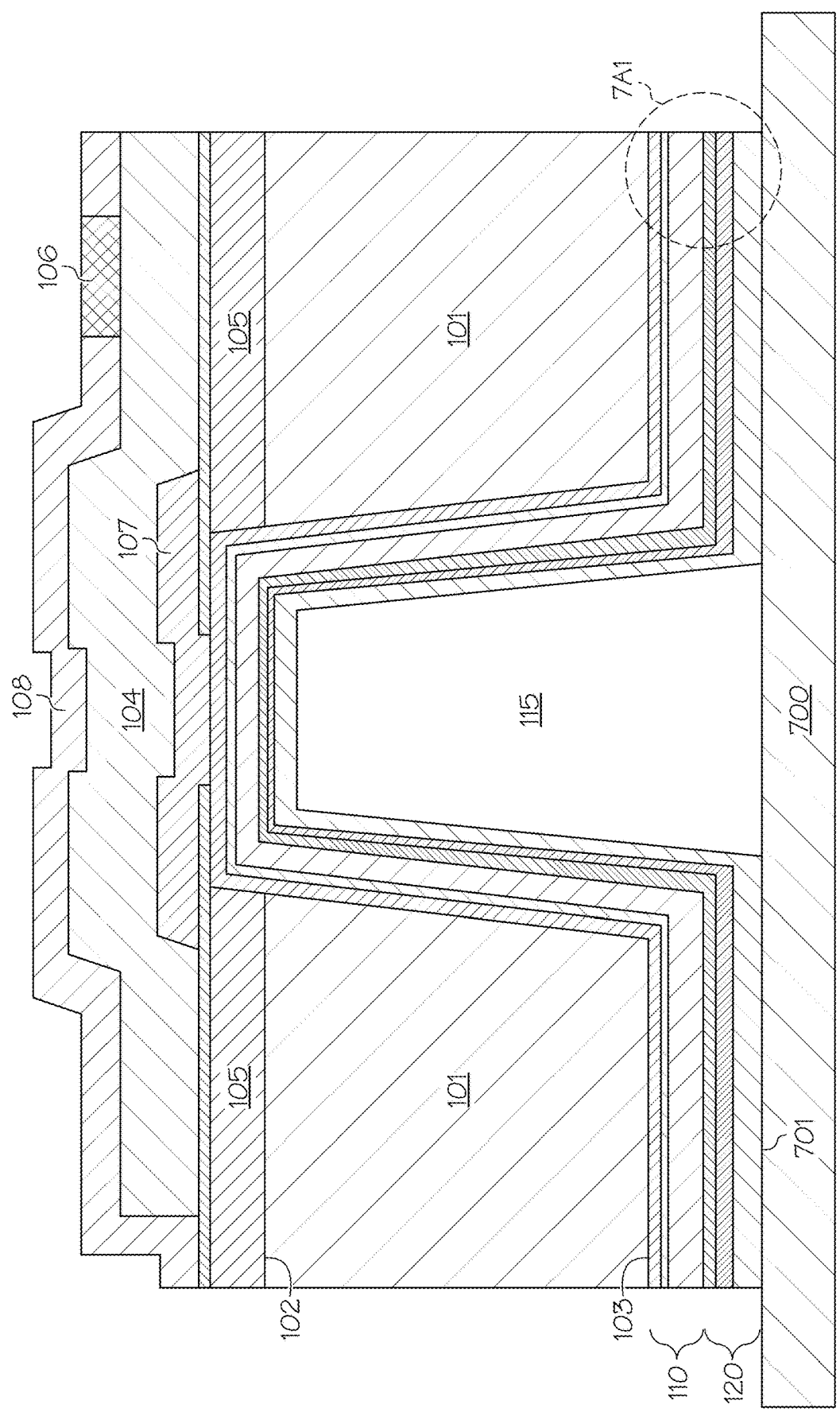
Figure 7B:
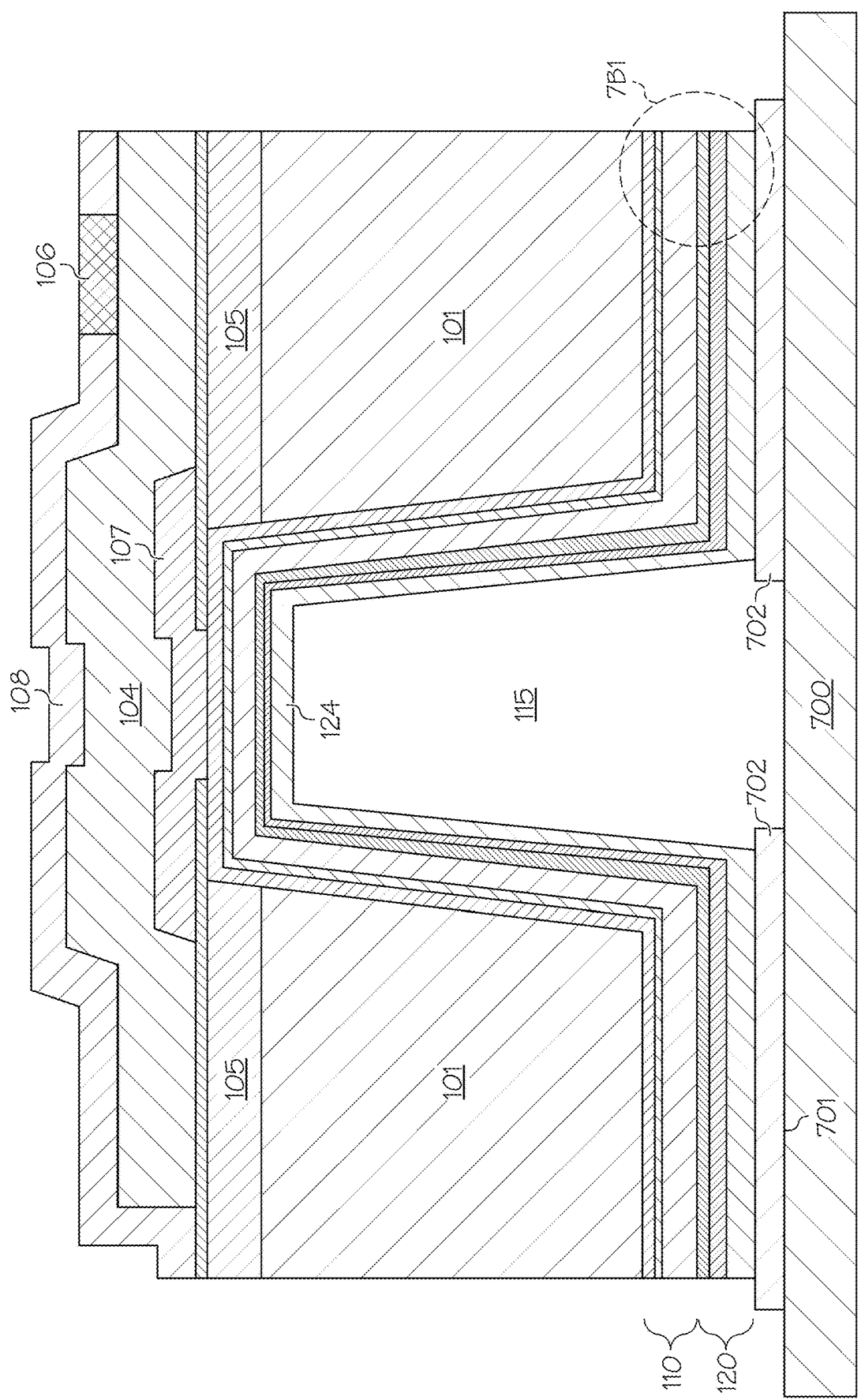

The die attach metal stack 120 includes one or more layers 121, 122, 123, and 124 of the same or different metals or metal alloys that are selected and formed to provide improved performance, yield, and/or reliability of the attachment of the semiconductor device structure 100 to a mounting substrate (such as the packaging substrate 700 shown in FIGS. 7A and 7B). For example, the die attach metal stack 120 may include a first adhesion layer 121, a barrier metal layer 122, a metal interlayer 123, and a die attach material layer 124. The first adhesion layer 121 may include one or more materials, alloys, and/or layers configured to promote adhesion with the surface of the contact metal 113. In some embodiments, the first adhesion layer 121 may include Ti, for example, having a thickness of about 0.01 μm to about 0.5 μm. The barrier metal layer 122 may include one or more materials, alloys, and/or layers configured to prevent migration of the material(s) of the die attach material 124 into the contact metal layer 113. In some embodiments, the barrier metal layer 122 may include platinum (Pt) and/or tungsten (W), for example, having thickness of about 0.1 μm to about 1 μm, e.g., 0.1 μm to 0.5 μm.

Some embodiments may include an additional metal interlayer 123 between the barrier metal layer 122 and the die attach material layer 124. The metal interlayer 123 may include one or more materials, alloys, and/or layers configured to alloy with and/or otherwise interact with the die attach material layer 124 so as to prevent contact between the liquid phase of the die attach material 124 and the barrier metal layer 122. In some embodiments, the metal interlayer 123 may include silver (Ag), nickel (Ni), palladium (Pd), and/or copper (Cu), for example, having thickness of about 0.1 µm to about 1 µm, e.g., 0.2 µm to 0.6 µm. The die attach material 124 may be a solderable metal (e.g., eutectic gold-tin (AuSn)) having a thickness of about 1 µm to about 10 µm.

In a typical solder process, transition of the die attach material 124 from a solid phase to a liquid phase may result in de-wetting to the barrier metal layer 122, and thus, to formation of voids and/or possible delamination of the die attach material 124 during solder cool down. In contrast, by using a metal interlayer 123 (such as Ni) between a eutectic die attach material layer 124 (such as AuSn) and a barrier metal layer 122 (such as PT or W), the Ni interlayer 123 may solidify or 'freeze' (i.e., raise the melting point of) the die attach material layer 124 along the interface therebetween or otherwise along the Pt or W barrier metal layer 122. In particular, the Ni interlayer 123 may alloy with the liquid phase AuSn layer 124 to form an alloy 125 (e.g., ternary NiAuSn) along the interface between the Ni interlayer 123 and the AuSn layer 124, thereby reducing de-wetting to the barrier metal layer 122 and increasing adhesion strength of the soldered backside metal stack 120 after die attach. That is, the metal interlayer 123 may interact with the liquid phase die attach material 124 to prevent the liquid phase solder material 124 from contacting the barrier metal layer 122, which may otherwise exhibit poor adhesion, ultimately resulting in low strength of the interface after die attach. The weakened interface may further compromise the overall die attach robustness (resulting in breaking or delamination of the solder joint) during device use or after repeated thermal cycles typical with device uses or stress testing.

The die attach material layer 124 may include one or more solderable materials, alloys, and/or layers configured to provide a low melting point. For example, the die attach material layer 124 may include a low melting point eutectic or near eutectic mixture of a desired metal alloy, such as AuSn, AuSb, AuGe, AuSi, AgSn, SnAg, CuSn, etc., in all-eutectic, over-eutectic, or under-eutectic compositions. As used herein, "near eutectic" may refer to up to about 25% over- or under-eutectic compositions. Eutectic AuSn may include about 80% Au and about 2% Sn. Near eutectic AuSn as described herein may range from about 60% Au and 40% Sn, to about 90% Au and 10% Sn. For example, an AuSn die attach material layer 124 may include about 70% Au and about 30% Sn, including relative concentrations that may vary while remaining sufficiently near eutectic to maintain a suitably low melting point. The die attach material layer 124 can be sputtered as a single or multiple layers. In some embodiments, the die attach material layer 124 may include multiple layers that are separated by respective, thinner layers. For example, an AuSn die attach material layer 124 may include multiple AuSn layers separated by respective thin Au layers, which may achieve a smoother surface finish. In other embodiments, the die attach material layer 124 may be a single layer sputtered all at once. The die attach material layer 124 may be thinner than the contact metal layer 113. For example, the die attach material layer 124 may have a thickness of about 4 µm in some embodiments.

An optional capping or protection layer may be formed on the die attach material layer 124, for example, as a passivation layer to reduce or avoid oxidation. The protection layer may include a noble metal (e.g., an Au cap layer) in some embodiments.

In embodiments including the via 115, the die attach metal stack 120 may be conformally formed on the surface 103 of the substrate 101 as well as along sidewall and bottom surfaces of the via 115. The thickness of one or more layers 121, 122, 123, and 124 of the die attach metal stack 120 on the surface 103 of the substrate 101 (portion "1A1" in FIG. 1A) may differ from the thickness of one or more layers 121, 122, 123, and 124 of the die attach metal stack 120 on the sidewalls (portion "B" in FIG. 1A) and/or bottom surface of the via 115.

The thickness of the die attach metal stack 120 may also vary depending on the particular implementation. The thickness of the die attach metal stack 120 should be thick enough to provide a continuous interface, and should account for a roughness of the mounting substrate to which the corresponding semiconductor die is to be mounted. In one particular non-limiting implementation, the thickness of the die attach metal stack 120 is in a range of about 5 to 15 microns, but may be thicker or thinner depending on factors such as, for instance, the roughness of the mounting substrate, the material used for the die attach metal stack 120, and/or a stress applied to the semiconductor die during and after attachment to the package substrate. More generally, the thicknesses of the metallization stack 130 and/or the sublayers thereof may vary depending on application, and are not limited to the example thicknesses and/or sublayers specifically described herein.

In some embodiments, the contact metal stack 110 may further include a metal interlayer (such as Ni) between the barrier metal layer 112 and the contact metal layer 113 to promote enhanced interfacial stability. For example, an additional Ni layer may be provided between the TiW barrier metal layer 112 and the Au contact metal layer 113, which may be plated in some embodiments. Additionally or alternatively, the adhesion layer 111 and the barrier metal layer 112 may be implemented as a stack of alternating layers 111/112. For example, the adhesion layer 111 and the barrier metal layer 112 may be implemented as alternating layers of Ti 111 and TiW 112 beneath the Au contact metal layer 113, or as alternating layers of TiW 111 and Pt 112 beneath the Au contact metal layer 113. Metallization stacks 130 as described herein can be used in applications for contact and die attach metallization of SiC wafers, die, RF devices, and/or power devices.

Figure 2:
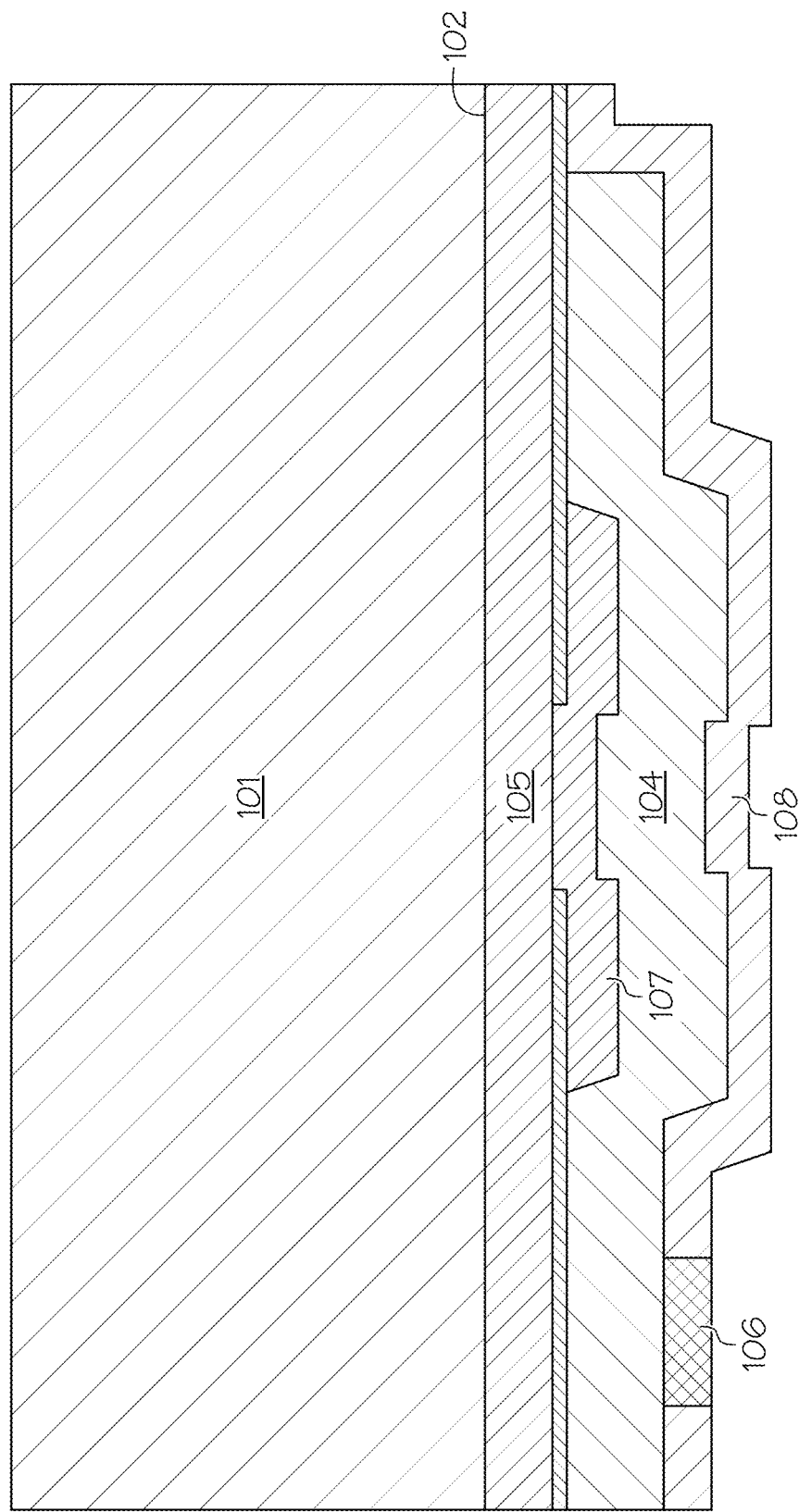
FIGS. 2-6 are schematic cross-sectional views of methods of fabricating a semiconductor device including metallization stacks according to some embodiments of the present disclosure.

FIGS. 2-7 are schematic cross-sectional views of methods of fabricating a semiconductor device including metallization stacks according to some embodiments of the present disclosure. Referring now to FIG. 2, a semiconductor device layer 105 is formed on a surface 102 of a substrate 101, illustrated by way of example as on a frontside surface 102 of a SiC substrate 101. As noted above, the semiconductor device layer 105 may be formed on the substrate 101 as one or more epitaxial layers. In some embodiments, the substrate 101 and the semiconductor device layer 105 may be the same material. In some embodiments, the semiconductor device layer 105 may include one or more layers of semiconductor material other than SiC (such as GaAs or GaN or other Group III nitride-based layers). Semiconductor devices, such as diodes, LEDs, FETs, or HEMTs, may be formed in regions of the semiconductor device layer 105. A metal layer 104, which may provide contacts for one or more of the semiconductor devices, may be formed on a surface of the semiconductor device layer 105 opposite the substrate 101, between interconnect metal layer 107 and passivation layer 108. A contact pad 106 may be formed within the passivation layer 108 for electrical contact to the metal layer 104. The pad 106 may be open or unfilled in some embodiments.

Figure 3:
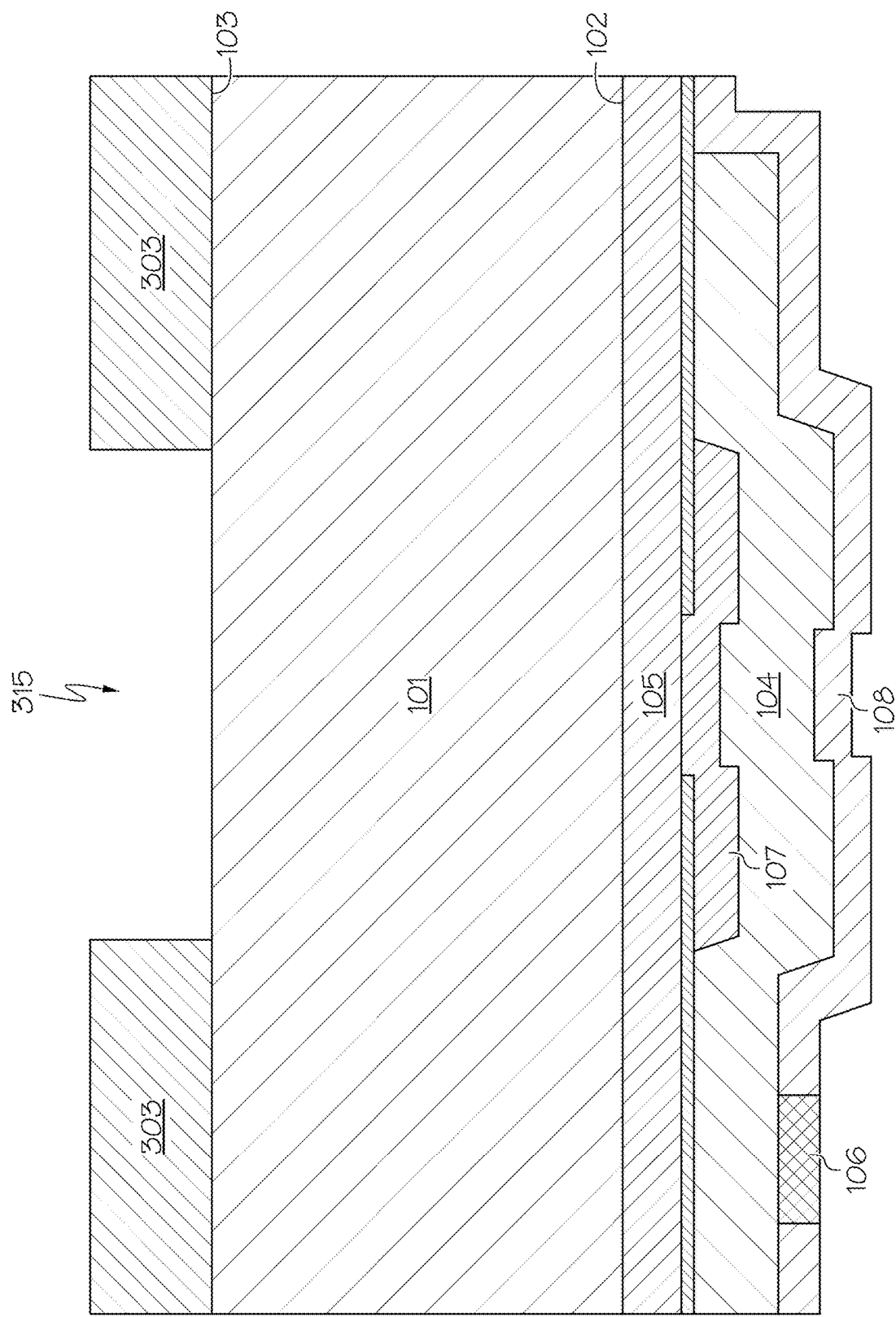
Figure 4:
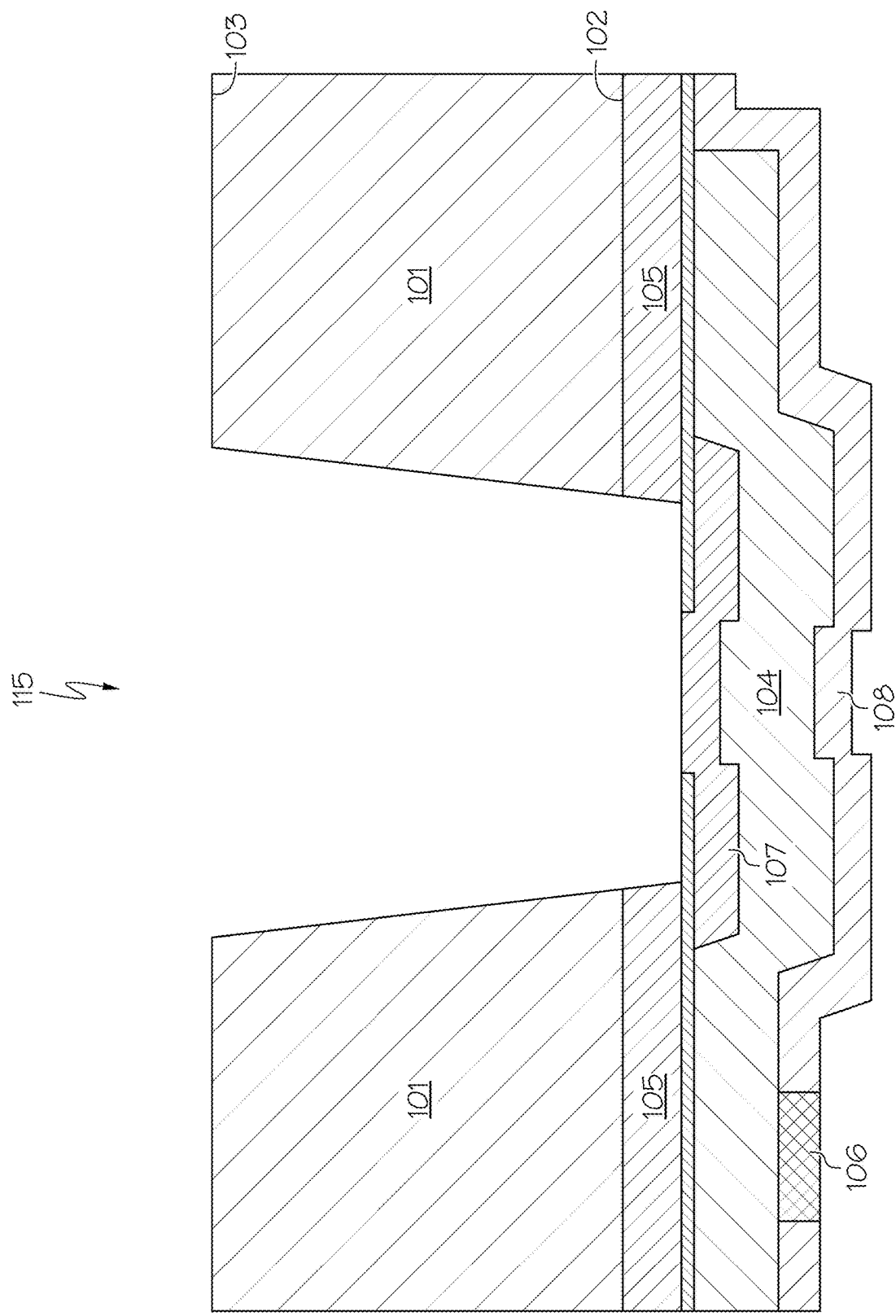

Referring to FIGS. 3 and 4, one or more through substrate vias 115 are formed on a surface 103 of the substrate 101, illustrated as a backside surface 103 that is opposite to the surface 102 that includes the semiconductor device layer 105 thereon. For example, as shown in FIG. 3, a mask pattern 303 including respective openings 315 therein is formed on the surface 103 of the substrate 101. As shown in FIG. 4, the portions of the surface 103 exposed by the mask pattern 303 are etched (e.g., by plasma etching), using the mask pattern 303 as an etching mask (e.g., a patterned resist layer), to define respective vias 115 (one of which is shown) extending from the backside surface 103 through the substrate 101 and into or through the semiconductor device layer 105. The via 115 may expose a portion of the underlying frontside metal interconnect layer 107 on the surface of the semiconductor device layer 105 and/or other conductive layers in contact therewith. In some embodiments, the via 115 may be formed in accordance with operations described in U.S. Pat. No. 9,490,169 to Ring et al., the disclosure of which is incorporated by reference herein.

Figure 5:
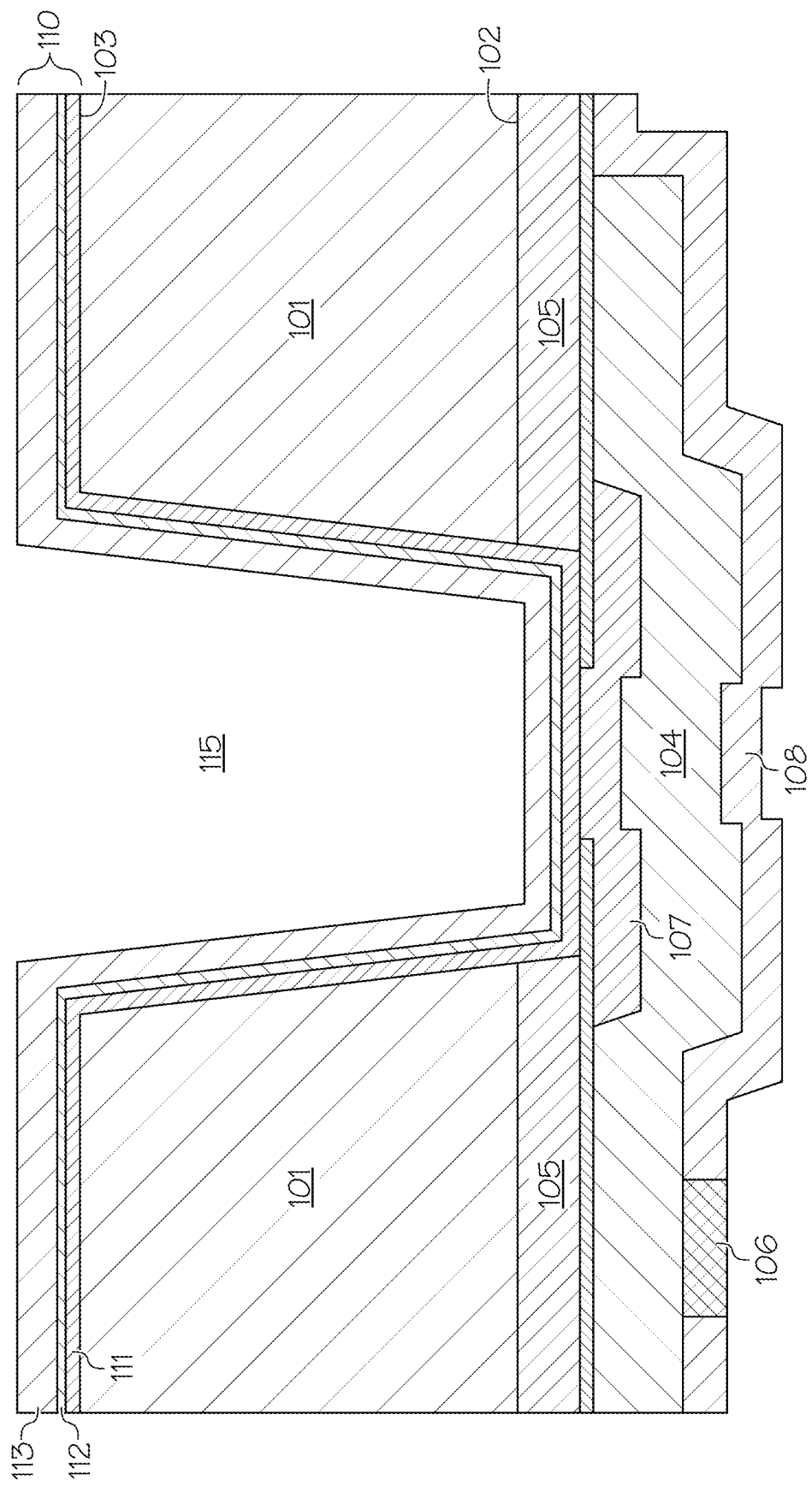

Referring now to FIG. 5, a first portion of a metallization layer including a contact metal stack 110 is formed on the backside surface 103 of the substrate 101 and within the via 115 to contact an underside of the metal layer 107 on the frontside surface 102, thereby electrically connecting the metal 104, 110 on the opposing sides 102, 103 of the substrate 103. As noted above, the contact metal stack 110 may include an adhesion layer 111, a barrier metal layer 112, and a contact metal layer 113, each of which may include one or more materials, alloys, and/or layers. In some embodiments, the adhesion layer 111 may be a Ti layer having a thickness of about 0.05 μm to about 1 μm, the barrier metal layer 112 maybe a TiW layer having a thickness of about 0.15 μm to about 1 μm and the contact metal layer 113 may be an Au layer having a thickness of about 1 μm to about 10 μm. For example, the contact metal stack 110 may include a 0.5 μm (±0.25 μm) Ti adhesion layer 111, a 0.5 μm (±0.25 μm) TiW barrier metal layer 112, and a 6 μm (±2 μm) Au contact metal layer 113 on a backside surface 103 of a SiC substrate 101. The contact metal layer 113 may be formed using an electroplating process, and may have a thickness sufficient to provide low electrical resistance and high electrical current capacity. The contact metal stack 110 on the surface 103 of the substrate 101, on the sidewall surfaces of the via 115, and/or on the bottom surface of the via 115 may have differing thicknesses in some embodiments. As shown in FIG. 5, the via 115 is not completely filled by the contact metal stack 110.

Figure 6:
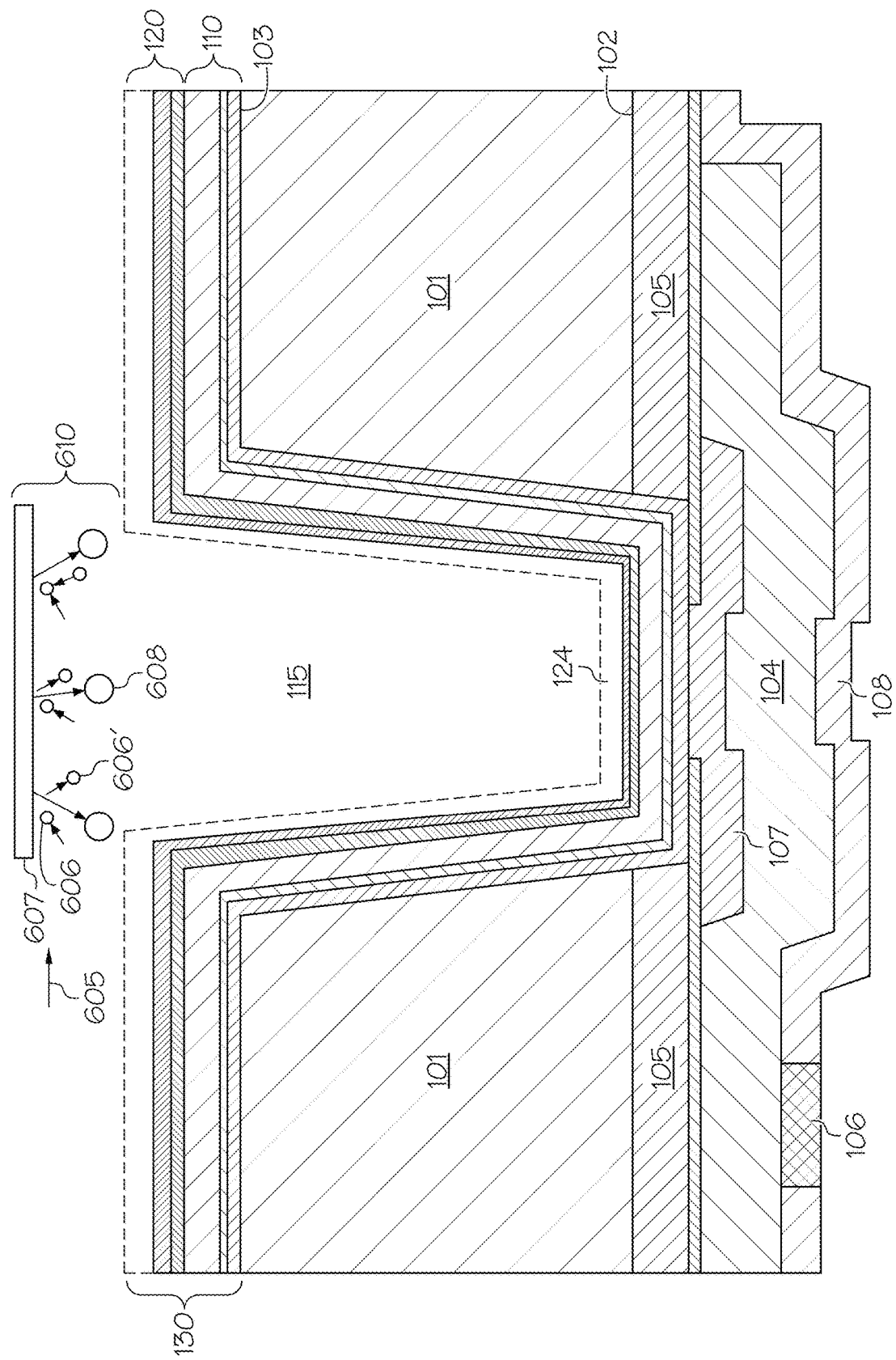

Referring now to FIG. 6, a second portion of a metallization layer including a die attach metal stack 120 is formed on the contact metal stack 110 on backside surface 103 of the substrate 101 and within the via 115. As noted above, the die attach metal stack 120 may include an adhesion layer 121, a barrier metal layer 122, an interlayer 123, and a die attach material layer 124, each of which may include one or more materials, alloys, and/or layers. For example, the die attach metal stack 120 may include a 0.01 μm-thick Ti adhesion layer 121, a 0.25 μm-thick Pt barrier metal layer 122, a 0.4 μm-thick Ni interlayer 123, and a 4 μm-thick AuSn die attach material layer 124 in some embodiments. Portions of the die attach metal stack 120 on the surface 103 of the substrate 101, on the sidewall surfaces of the via 115, and/or on the bottom surface of the via 115 may have differing thicknesses in some embodiments. As shown in FIG. 6, the via 115 is not completely filled by the die attach metal stack 120.

Die attach of devices 100 using post-fabrication die attach methods (e.g. use of AuSn solder preforms, solder paste, etc.) in which the vias 115 are not filled (or "plugged") may typically require further downstream processing methods. For example, an additional process may be used to form a solder dewetting layer within an unfilled via, in order to prevent solder from filling the vias and resulting in contaminant migration and/or diffusion after stressing the device 100. However, in accordance with embodiments described herein, the formation of the barrier metal layer 122 (e.g., a Pt-based layer) and/or the metal interlayer 123 (e.g., a Ni—, Ag—, Pd—, or Cu-based interlayer) extending conformally along surfaces of the via 115, followed by deposition of the die attach material layer 124 (e.g., AuSn), can reduce or prevent migration of contaminants (e.g., Sn) from the die attach material layer 124 without the presence of a solder de-wetting layer in the unfilled via 115, and may allow for more efficient metallization processing to achieve high performance and high-reliability devices on SiC.

To form the die attach metal stack 120 shown in FIG. 6, some embodiments are directed to a sputter deposition process using a sputter gas including one or more elements having an atomic mass that is closer to that of a target material 607 to be sputtered. In some embodiments, the sputter gas may include at least one element having an atomic mass that is greater than about 40%, greater than about 60%, or even greater than about 115% of that of the target material. That is, the sputter gas may include an element having an atomic mass within about ±15% to within about ±60% of the atomic mass of the target material. In some embodiments, the target material 607 may include Au. For example, the target 607 may be an AuSn target. More generally, while described herein with reference to Ar-containing sputter gases and AuSn die attach material layers, it will be understood that embodiments described herein may include any combination of sputter gas and die attach materials including an element having an atomic mass that is similar to one or more elements of the sputter gas.

In particular, a sputter deposition process according to some embodiments may use a sputter gas including one or more elements having an atomic mass that is greater than Ar, which may be closer to the atomic mass of the target material to be sputtered (e.g., AuSn), and may thereby result in reduced contamination of the sputtered layer with the element(s) of the sputter gas. As mentioned above, the low mass ratio of Ar atoms (having an atomic mass of about 39.8 atomic mass units (g/mol)) to Au atoms (having an atomic mass of about 196.97 g/mol) may result in a higher reflection rate of the Ar atoms, such that accelerated Ar atoms may bombard the sputtered layer 124 during the sputter deposition process. As such, Ar (or other sputter gas elements) may be incorporated into interstitial lattice positions in the sputtered AuSn (or other) die attach material layer 124 during the sputtering process, with the amount or concentration of Ar being incorporated into the sputtered AuSn depending on the power, reflected power, sputter gas concentration, and/or temperature during sputtering. Such contaminant atoms from the sputter gas may manifest as voids in the sputtered layer when the die attach material layer transitions from a solid phase to a liquid phase, with different post-sputter processing conditions (such as different die attach operations) resulting in different amounts or concentrations of voids.

Figure 8A:
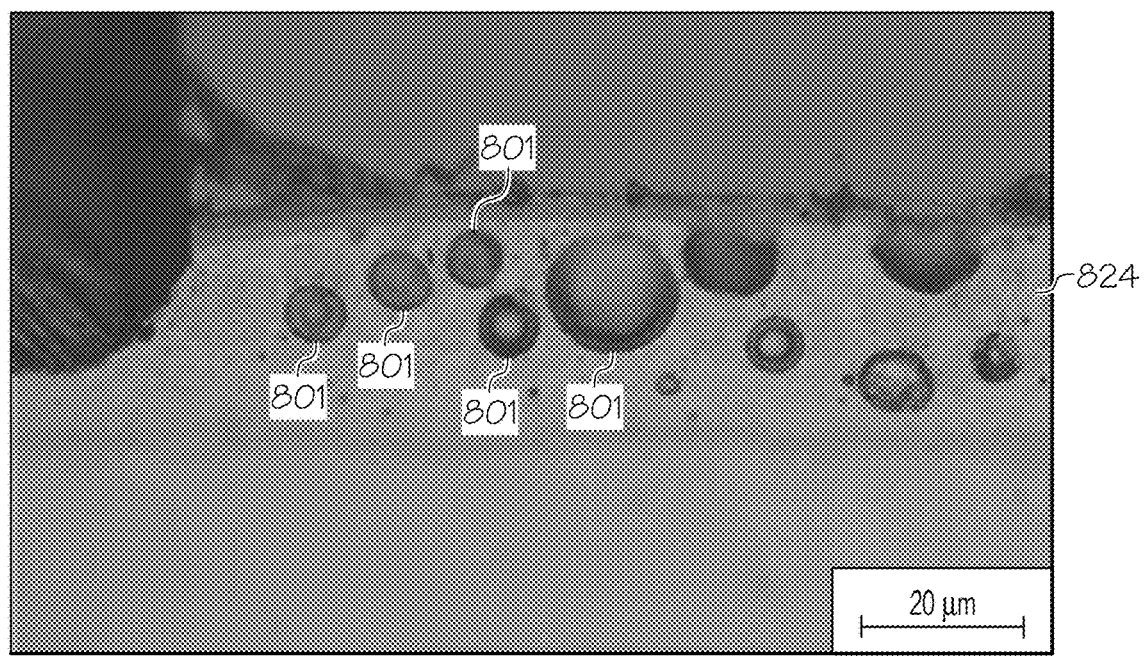
FIG. 8A is an enlarged view illustrating voids in a die attach material layer due to incorporation of sputter gas elements.
Figure 8B:
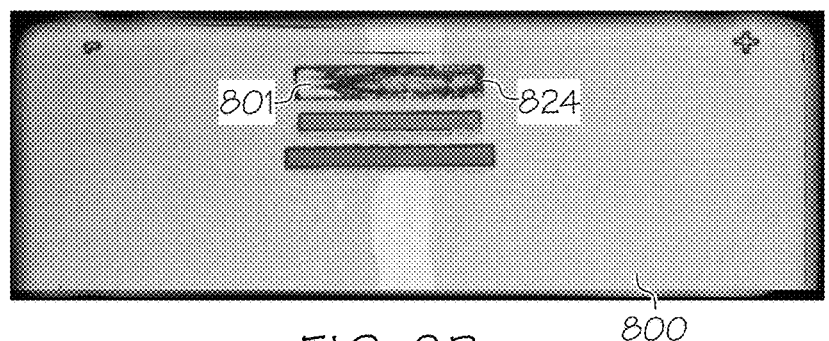
FIG. 8B is an enlarged plan view C-mode scanning acoustic microscopy (C-SAM) image illustrating post-die attach void formation due to incorporation of sputter gas elements in a sputtered die attach material layer in attachment of a semiconductor device to a package substrate.

FIGS. 8A and 8B are images illustrating various formation of voids 801 in an AuSn layer 824 using an Ar sputtering gas. In particular, FIG. 8A is a cross-sectional view of the AuSn layer 824 illustrating the voids 801, while FIG. 8B is a C-SAM image illustrating a through-scan of the AuSn layer 824 in plan view across the entire die attach area, with the voids 801 appearing as non-uniformities or lighter discolorations over the surface area of the AuSn layer 824 on a substrate 800. For purposes of illustration, the sputter gas used in forming the AuSn layer 824 is substantially Ar-based, that is, including Ar concentrations of up to about 100 percent. As shown in FIGS. 8A and 8B, at least some void formation will typically be present in the sputtered AuSn layer 824 due to incorporation of Ar from the sputter gas, particularly in larger dies (e.g., having a surface area of greater than one square millimeter). Diffusion of Ni or Ag into the AuSn layer 824 may solidify the AuSn layer 824 and 'freeze' the metal stack during die attach or reflow by forming ternary phases of NiAuSn or AgAuSn. Also, the viscosity of the AuSn layer 824 may be relatively high near the melting point temperature (especially for near-eutectic (e.g., over- and under-eutectic) layers, which may include solid alloys suspended in the liquid composition), such that the voids 801 therein cannot easily travel in the AuSn layer 824 to escape at edges or boundaries. Depending on process conditions, the sputtered AuSn layer 824 may have a void percent of about 25% or more.

Figure 8C:
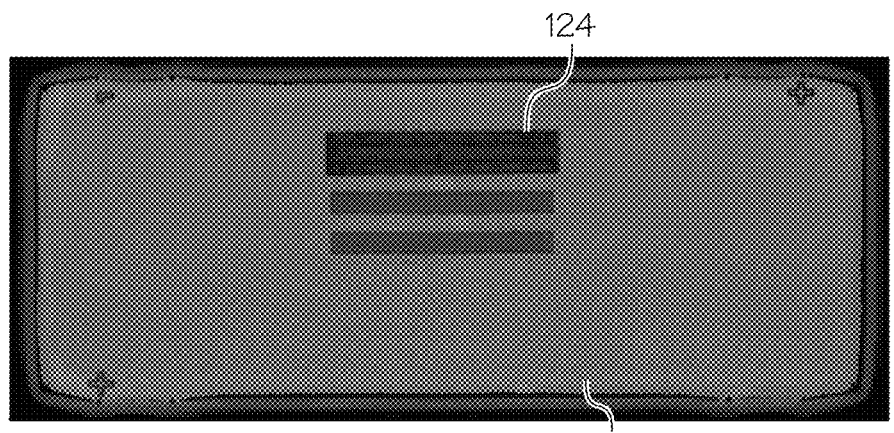
FIG. 8C is an enlarged plan view C-SAM image illustrating a sputtered die attach material layer in attachment of a semiconductor device to a package substrate according to some embodiments of the present disclosure.

In contrast to the AuSn layer 824 formed by Ar-based sputtering, FIG. 8C is a C-SAM image illustrating a through-scan of an AuSn layer 124 in plan view across the die attach area. The AuSn layer 124 is formed using a sputter deposition process in accordance with embodiments described herein. In particular, the AuSn layer 124 shown in FIG. 8C is formed using a sputter gas that is substantially Kr-based, that is, including Kr concentrations of up to about 100 percent. As illustrated in FIG. 8C, for a die attach surface area equal or greater than that of the AuSn layer 824 shown in FIG. 8B, little to no void formation is present in the AuSn layer 124. For example, the AuSn layer 124 may have about 0 to about 3 void percent, as shown by the absence of non-uniformities or lighter discolorations over the surface area of the AuSn layer 124 on the substrate 700 in FIG. 8C.

FIG. 6 further illustrates formation of one or more layers 121, 122, 123, and/or 124 of the die attach stack 120 using a sputter deposition process where the sputter gas 605 includes one or more elements that are closer in atomic weight to one or more materials of the sputter target 607 than Ar. The sputter gas 605 may include noble gases other than or in addition to Ar, including Kr, Xe, and/or Rn. That is, the sputter gas 605 may include any mixture of Ar, Kr, Xe, and/or Rn (beyond that which may be naturally occurring), including Ar concentrations from about 0 (i.e., only naturally occurring amounts of Ar) to up to about 50% Ar.

As shown in FIG. 6, the sputter gas 605 is delivered by a gas supply system. After reaching a desired pressure, the sputter gas 605 is ionized to generate a plasma 610 including ions 606, such as Ar, Kr, Xe, and/or Rn ions. The ions 606 of the plasma 610 are accelerated towards a target material 607, e.g., by an applied field (for example, by a permanent magnet (i.e., magnetron sputtering)). Due to the impact of the ions 606 on the target material 607, atoms or particles 608 are ejected from the target material 607 and directed toward the second surface 103 of the SiC substrate 101 to deposit one or more layers 121, 122, 123, and/or 124 of the die attach metal stack 120. In FIG. 6, the die attach metal stack 120 includes a Ti adhesion layer 121, a Pt barrier 122, a Ni metal interlayer 123, and an AuSn die attach material layer 124, but it will be understood that these materials are described by way of example rather than limitation, and that one or more of the layers 121, 122, 123 may be omitted in some embodiments.

In addition, at least some of the ions 606 of the plasma 610 are reflected (shown by 606') toward the SiC substrate 101 with sufficient energy to be incorporated in one or more of the deposited layers 121, 122, 123, and/or 124. For example, for a source gas 605 including Kr, Xe, and/or Rn, some Kr, Xe, and/or Rn atoms may be incorporated into interstitial lattice positions in the sputtered AuSn (or other) die attach material layer 124.

The amount of Kr, Xe, and/or Rn incorporated in the die attach material layer 124 may depend on relative atomic mass (or mass ratio) of the elements of the sputter gas 605 to the material of the sputter target 607, as well as the relative concentration of the elements of the sputter gas 605 with respect to Ar therein and other process conditions. For example, in some embodiments, the sputter gas 605 may be substantially free of Ar (e.g., the sputter gas 605 may include about 100% Kr, Xe, and/or Rn), and the die attach material layer 124 may thus be free of Ar (beyond that which may be incorporated due to naturally occurring amounts) with a void percent of about 5 or less (e.g., about 0 to 3 void percent). In some embodiments, the sputter gas 605 may include about 25% Ar (e.g., the sputter gas 605 includes about 75% Kr, Xe, and/or Rn), and the die attach material layer 124 may have a void percent of about 10% or less. In some embodiments, the sputter gas 605 may include about 50% Ar (e.g., the sputter gas 605 includes about 50% Kr, Xe, and/or Rn), and the die attach material layer 124 may have a void percent of about 15% or less. In some embodiments, the sputter gas 605 may include about 75% Ar (e.g., the sputter gas 605 includes about 25% Kr, Xe, and/or Rn), and the die attach material layer 124 may have a void percent of about 25% or less.

Heavier elements may have lower reflection rates as the sputter energy (E or $E_0$) increases, due to lower mass ratios relative to Ar. The probability of atoms being reflected towards a wafer or substrate can be calculated from the ratio between reflected energy (E') to incident sputter energy (E; also referred to herein as incident energy). For an elastic two-body collision at incident angles of about 90 degrees, the probabilities for a sputter gas including Ar (39.8 g/mol), Kr (83.8 g/mol), or Xe (131.3 g/mol) with respect to a target material including Au (196.97 g/mol) may be represented as:

Ar/Au→E'/E→0.66
Kr/Au→E'/E→0.40
Xe/Au→E'/E→0.20

As shown above, the ratio of E'/E for Ar ions is greater than 60%, while the ratios of E'/E for Kr and Xe ions are less than about 40%. The probability of reflection (and resulting incorporation into a sputtered AuSn layer) may thus be relatively high for Ar, while Kr or Xe (or Rn) may be incorporated into the sputtered AuSn layer in lesser amounts. That is, the sputtered material layer may include concentrations of Ar, Kr, Xe, and/or Rn that are disproportionate to the relative concentrations of Ar, Kr, Xe, and/or Rn in the sputter gas, due to their differing probabilities of reflection.

Due to the lower reflected energy of sputter gases containing elements closer in atomic weight to the target materials to be sputtered as described herein, one or more layers 121, 122, 123, and/or 124 of the die attach stack 120 formed by sputter processes in accordance with embodiments of the present disclosure may include less noble gas contamination than layers formed using an Ar sputter gas. For example, sputter deposition processes using Kr, Xe, and/or Rn may result in formation of die attach material layers 124 (such as low melting alloys and eutectic or near eutectic solder) having a void percent of less than about 25%, less than about 15%, less than about 10%, or less than about 5% (e.g., less than about 3%), for sputter gas Ar concentrations of less than about 75%, less than about 50%, less than about 25% and about 0%, respectively. It will be understood that, due to non-idealized processing conditions, some void formation in the die attach material layer 124 may be present due to surface contamination and/or atmospheric conditions (e.g., naturally occurring or necessarily present amounts of Ar, including impurities, in the gas 605). Also, it will be understood that other processing conditions (e.g., temperature, pressure, equipment, power) may affect void formation.

In addition, due to the higher efficiency of sputter gases including one or more noble gases that are heavier than Ar, the temperature of the substrate may be reduced, depending on the process parameters employed. Sputter deposition processes as described herein may result in a finer grain structure of the deposited die attach material layer 124, which may improve solderability during subsequent die attach operations. For example, the die attach material layer 124 may alloy with the adhesion layer 121 during sputtering, which would be problematic because it is increasing the melting point of the solderable material 124. Sputter deposition processes as described herein may also allow for a faster deposition rate (which may improve cost efficiency by increasing manufactured units per hour) and/or provide improved stability of the underlying layers.

Some benefits of reducing sputter gas incorporation into the sputtered die attach material layer 124 in accordance with embodiments described herein may not be evident immediately after the sputter deposition process shown in FIG. 6, but may be critical to the success of subsequent processing, such as the die attach operations as described herein. For example, as some void formation may occur due to outgassing of trapped deposition contaminants during phase transition of the die attach material layer 124, effects of reduced sputter gas contamination as described herein may manifest under post-sputter processing conditions in which outgassing may be more violent and/or in which the resulting voids cannot otherwise easily escape from the die attach material layer 124. Factors in such post-sputter processing conditions may include, but are not limited to, the duration of the phase transition of the die attach material layer (including temperature and/or ramping time of the phase transition), as well as the surface area and thickness of the die attach material layer.

Such post-sputter processing conditions may include atmospheric isothermal die attach operations with direct placement on a package substrate, for example, at temperatures from about 290 degrees Celsius (C) to about 350 degrees C. Void formation may be particularly problematic in attachment of die having surface areas of greater than about 1 mm$^2$, greater than about 3 mm$^2$, or greater than about 5 mm$^2$ to a package substrate, and/or where the material of the package substrate has a higher coefficient of thermal expansion (CTE) than (i.e. CTE mismatch with) the material of the die. That is, void formation in die attach material layers formed by Ar-based sputtering may be increasingly problematic as die attachment surface area increases. As such, fabrication of die attach material layers having reduced void concentration in accordance with embodiments described herein may be critical to achieving a stronger bond interface and reduced likelihood of delamination from a die attach region of a package substrate.

Embodiments described herein may thus provide improved performance, yield, and/or reliability for devices having greater die attachment material contact areas and thicknesses, as well as under post-sputter processing conditions with faster processing times and/or faster ramping of process temperatures.

FIGS. 7A and 7B are schematic cross-sectional views illustrating attachment of the semiconductor structure 100 to a package substrate 700. FIG. 7A1 is an enlarged view of a portion of FIG. 7A, and FIG. 7B1 is an enlarged view of a portion of FIG. 7B. In FIG. 7A, the semiconductor structure 100 is mounted on a die attach region or flange 701 of the package substrate 700 using a direct attachment of the die attach material layer 124 to the flange 701. In FIG. 7B, the semiconductor structure 100 is mounted on the die attach region or flange 701 of the package substrate 700 with a flux layer 702 between the die attach material layer 124 and the flange 701. The flux layer 702 may be formed by dispensing of a flux material on the flange 701 and/or the die attach material layer 124 prior to attachment. The flux layer 702 may reduce oxidation, and may aid in spreading and/or wetting of the die attach material layer 124 on the flange 701.

As discussed above, the die attach material layer 124 may include an electrically conductive material, such as gold-tin (AuSn), gold-silicon (AuSi), gold-germanium (AuGe), etc. The die attach material layer 124 may include more than one layer or component that are configured to solidify when cooled from temperatures of the die attach process.

The flange or die attach region 701 may be a surface of a package substrate 700 in some embodiments. The package substrate 700 and/or the die attach region 701 may include copper-molybdenum (Cu—Mo), or other Cu alloy, including high-Cu concentration alloys (e.g., greater than about 85% Cu, including pure Cu or 'near' Cu alloys, such as K80), or composites thereof. For example, the package substrate 700 and/or the die attach region 701 may be a copper alloy, such as copper-tungsten (CuW) or CPC (a copper, copper-molybdenum, copper laminate), or a metal-matrix composite. The package substrate 700 and/or the die attach region 701 may include Cu alloys with various concentrations of Cu and Mo. The CTE (referred to herein in parts-per-million per degree Celsius (PPM/° C.) for the package substrate 700 and/or the die attach region 701 may be about 7 to 17. In some embodiments, one or more regions of the package substrate 700 (including the die attach region 701) may be plated with one or more metals, including (but not limited to) NiAu, NiPdAu, Ag, for example, to reduce or prevent oxidation of larger regions of a Cu-based substrate 700.

The contact metal 113 may be an electrically conductive material, such as gold or a gold alloy, that provides desired resistance, conductivity, or other performance characteristics (e.g., for RF performance), and defines a bonding surface for attachment of the die 100 to the package substrate 700 or flange 701 via the die attach material layer 124. As shown in FIGS. 7A and 7B, the connection between die 100 and flange 701 may include an unfilled via 115. The connection between the die 100 and the package substrate 700, also referred to herein as a bond area, may thus include the contact metal stack 110, the die attach metal stack 120, and/or the die attach region/flange 701. The materials described herein for the contact metal stack 110, the die attach metal stack 120, and the flange 701 are provided by way of example rather than limitation. In some embodiments, the materials of the contact metal stack 110, the die attach metal stack 120, and the flange 701 may have similar CTEs (e.g., about 14.4, 16, and 17, respectively, for an Au metal layer 113, an AuSn die attach material 124, and a Cu flange 701).

In some embodiments, there may be a significant CTE mismatch between the die attach region 701 of the package substrate 700 and the die 100 mounted thereon. The die 100 (including the substrate 101 and the semiconductor device layer 105) may be SiC-based and/or GaN-based, and may have CTE of about 2 to 5. For example, a SiC substrate 101 and a copper-based die attach region 701 may have a CTE mismatch of about 15 or more, and the CTE of the copper-based die attach region 701 may be greater than that of the SiC substrate by a factor of about 4 or more. That is, in some embodiments, the CTE of the die attach region 701 may be at least two times, at least three times, or at least four times greater than the CTE of die 100 attached thereto. Such differences in CTE may contribute to concentration of stress in the bond area between the die attach material layer 124 and the die attach region 701, which may result in weakening of the bond interface and/or delamination of the substrate 101 from the package substrate 700.

In some embodiments, stresses due to CTE mismatch can be alleviated by providing the metal interlayer 123 between the barrier metal layer 122 and the die attach material layer 124 of the die attach metal stack 120, and/or by adjusting the stoichiometry of the materials of the die attach material layer 124, alone or in combination with the sputtering operations for reduced void formation in the die attach material layer 124 as described herein. As discussed above, the metal interlayer 123 includes one or more metals (e.g., Ni, Ag, Pd, Cu), alloys, and/or layers configured to react with the die attach material layer 124 during the die attach process (for example, by forming an alloy 125 along the interface therebetween), so as to prevent contact between the liquid phase of the die attach material 124 and the barrier metal layer 122. Such contact may otherwise result in "dewetting" to the barrier metal layer 122 and/or weak adhesion between the barrier metal layer 122 and the die attach material layer 124. For example, in embodiments where the die attach material layer 124 is AuSn and the metal interlayer 123 is Ni, the transition of the AuSn layer 124 into a liquid phase during the die attach process may alloy with the Ni metal interlayer 123 to form a ternary NiAuSn alloy 125. The interaction of the metal interlayer 123 with the liquid phase die attach material 124 may thus strengthen the bond area, which may be sufficient to withstand stresses due to the CTE mismatch between the SiC substrate 101 and the flange 701. While described herein primarily with reference to ternary alloys, it will be understood that the alloy 125 formed at or along the interface between the die attach material layer 124 and the metal interlayer 125 may be other (e.g., quaternary) alloys, depending on the materials of the layers 124 and 123.

In some embodiments, stress resulting from the differences or mismatch in CTE between the materials of the substrate 101 and the package substrate 700 may be concentrated at orthogonal corners or other abrupt changes in shape in the bond area. The bond between the die attach material layer 124 and the die attach region or flange 701 of the package substrate 700 may be further strengthened by shaping the die 101 and/or bond interface to define a contact area having non-orthogonal corners, for example, as described in commonly-owned U.S. patent application Ser. No. 16/421,824, filed May 24, 2019, the disclosure of which is incorporated by reference herein.

Semiconductor device packages in accordance with embodiments of the present disclosure, such as the package 100, may include additional components not shown in FIGS. 7A-7B, such as a case or housing, additional electrically conductive or thermally conductive components, additional die, passive components (e.g., ceramic capacitors, internal passive devices), and/or additional semiconductor components. Also, the semiconductor device layer 105 may include one or more semiconductor devices therein, such as Schottky diodes, RF power transistor devices, e.g., HEMTs and/or power MOSFETs such as LDMOS devices or SiC MOSFETs. Examples of such semiconductor devices are described below with reference to FIGS. 9A and 9B.

Figure 9A:
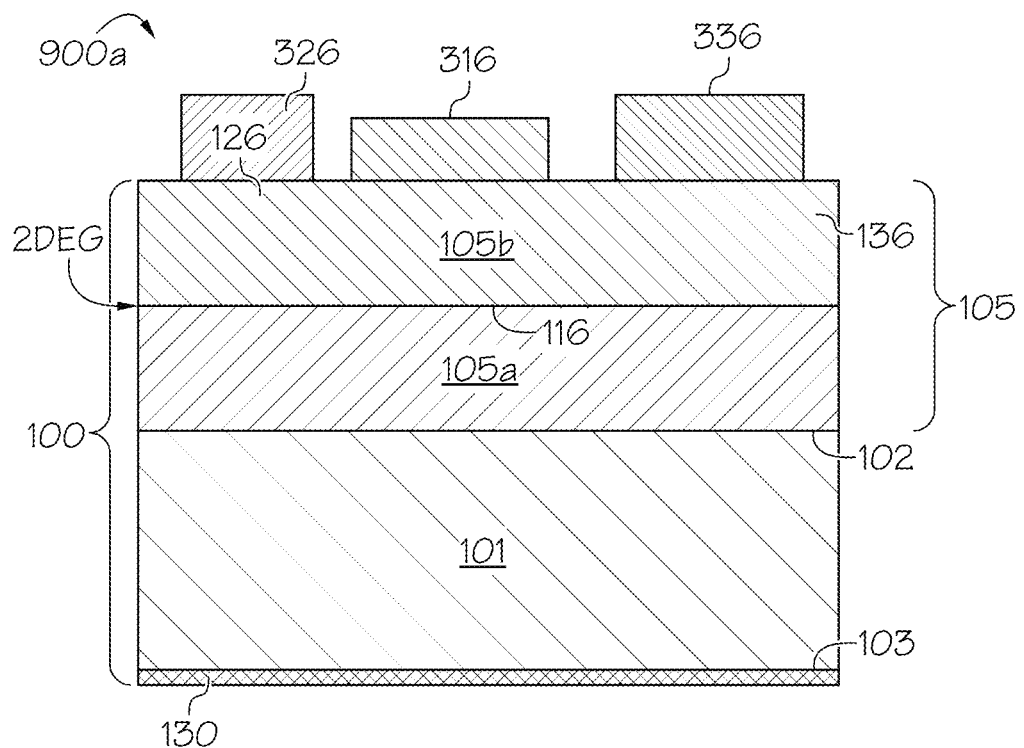
FIG. 9A is a cross-sectional view of a HEMT cell structure on a semiconductor die including metallization stacks in accordance with some embodiments of the present disclosure.

FIG. 9A is a cross-sectional view illustrating implementation of a HEMT cell structure 900a on a substrate 101 in accordance with some embodiments of the present disclosure. As shown in FIG. 9A, a HEMT transistor cell 900a may include a semiconductor die 100 (including a substrate 101 and an epitaxial device layer 105 on a frontside surface 102 of the substrate 101), and a metallization stack 130 on a backside surface 103 of the substrate 101. The epitaxial structure 105 may include a channel layer 105a that is formed on the substrate 101, and a barrier layer 105b that is formed on the channel layer 124. The channel layer 105a and the barrier layer 105b may include Group III-nitride based materials, with the material of the barrier layer 105b having a higher bandgap than the material of the channel layer 105a. For example, the channel layer 105a may comprise GaN, while the barrier layer 105b may comprise AlGaN. While the channel layer 105a and the barrier layer 105b are illustrated as single layer structures, it will be appreciated that either or both the channel layer 105a and/or the barrier layer 105b may be implemented as multi-layer structures. It will also be appreciated that additional layers such as, for example, buffer layers, strain-balancing layers, transition layers and the like may also be included as part of the epitaxial structure provided on the substrate 101.

Due to the difference in bandgap between the materials of barrier layer 105b and the channel layer 105a and piezoelectric effects at the interface between the barrier layer 105b and the channel layer 105a, a two dimensional electron gas (2DEG) is induced in the channel layer 105a at a junction 116 between the channel layer 105a and the barrier layer 105b. The 2DEG acts as a highly conductive layer that allows conduction between the source region 126 and drain region 136 of the device beneath a source contact 326 and a drain contact 336, respectively. The source contact 326 and the drain contact 336 are formed on the barrier layer 105b. A gate contact 316 is formed on the barrier layer 105b between the drain contact 336 and the source contact 326. In some embodiments, a via (such as the via 115 described herein) may be formed to provide electrical contact between one or more of the contacts 316, 326, 336 and the backside metallization stack 130.

Figure 9B:
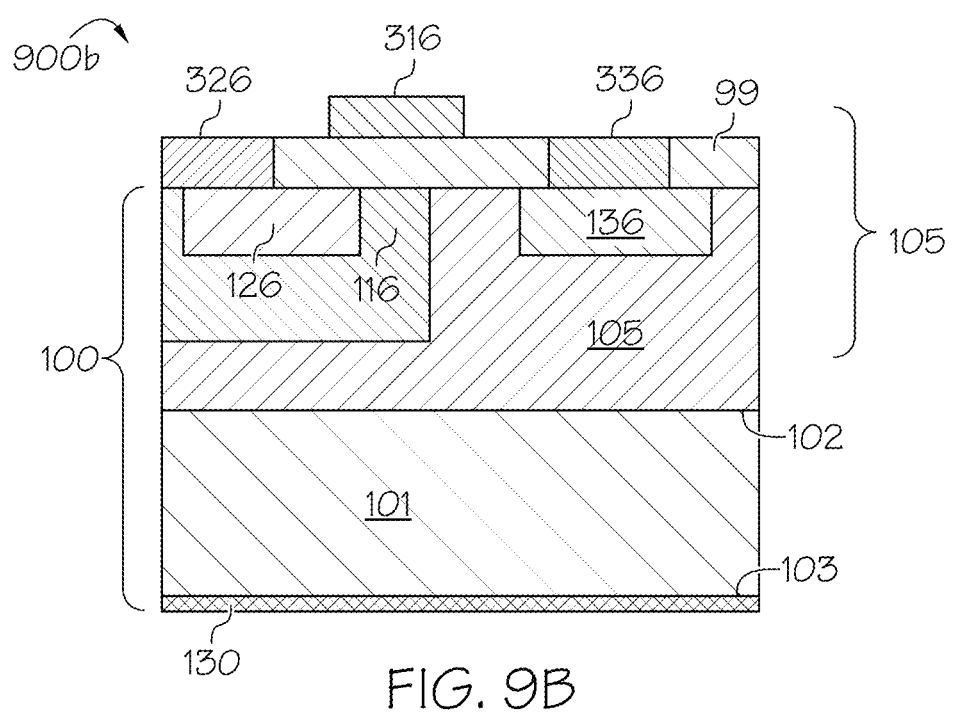
FIG. 9B is a cross-sectional view of a laterally diffused metal oxide semiconductor (LDMOS) transistor device cell structure on a semiconductor die including metallization stacks in accordance with some embodiments of the present disclosure.

FIG. 9B is a cross-sectional view illustrating implementation of a metal-oxide-semiconductor field effect transistor (MOSFET) cell, in particular, a laterally diffused metal oxide semiconductor (LDMOS) transistor device cell structure 900b on a substrate 101 in accordance with some embodiments of the present disclosure. The LDMOS is a 3-terminal transistor device that has a source region 126, a channel region 116, and a drain region 136 that are formed in or on a semiconductor die 100. The semiconductor die 100 may, for example, include a SiC substrate 101 and a semiconductor device layer 105 on a frontside surface 102 thereof. A metallization stack 130 may be formed on a backside surface 103 of the substrate 101. The substrate 101 may be of p-type conductivity, and the device layer 105 may provide drift layer (e.g., of n-type conductivity) thereon. The LDMOS transistor cell 900b may include doped well regions providing the source region 126 and drain region 136. The source region 126, drain region 136, and channel region 116 of the LDMOS transistor cell 900b may be coupled to contacts for operation of the LDMOS transistor cell. For example, the channel region 116 may be electrically coupled to the gate contact 316, drain region 136 may be electrically coupled to the drain contact 336, and source region 126 may be electrically coupled to source contact 326. The channel region 116 is isolated from the gate contact 316 by an insulator layer 99 (e.g., $SiO_2$). Applying a positive voltage to the channel region 116 with respect to the source region 126 may provide for a current to flow between drain region 136 and the source region 126 by forming an inversion layer (e.g., a channel) between the source region 126 and the drain region 136. LDMOS FETs may operate in "enhancement mode," meaning the drain-source current may not flow until an applied positive gate voltage enhances a channel between the drain region 136 and the source region 126. In some embodiments, a via (such as the via 115 described herein) may be formed to provide electrical contact between one or more of the contacts 316, 326, 336 and the backside metallization stack 130.

The HEMT and LDMOS devices of FIGS. 9A and 9B are included as examples for possible configurations of a transistor unit cell, but it will be understood that other transistor cell configurations could be utilized in die attachment of high elastic modulus semiconductor dies as described herein without deviating from the scope of embodiments of the present disclosure. As such, the present invention is not limited to HEMT and LDMOS transistor cells.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A semiconductor device package, comprising:
  a package substrate comprising a die attach region;
  a silicon carbide (SiC) substrate having a first surface including a semiconductor device layer thereon and a second surface that is opposite the first surface;
  a die attach metal stack comprising a sputtered die attach material layer that attaches the second surface of the SiC substrate to the die attach region of the package substrate, wherein the sputtered die attach material layer comprises a void percent of about 15% or less, wherein the die attach metal stack further comprises:
    a first barrier metal layer on the second surface of the SiC substrate;
    a metal interlayer that is between the first barrier metal layer and the sputtered die attach material layer and is configured to react with the sputtered die attach material layer to prevent contact between the first barrier metal layer and the sputtered die attach material layer during a phase transition thereof;
    a first adhesion layer between the first barrier metal layer and the second surface of the SiC substrate; and
  a contact metal stack between the die attach metal stack and the second surface of the SiC substrate, the contact metal stack comprising a second adhesion layer on the second surface of the SiC substrate, a second barrier metal layer on the second adhesion layer, and a contact metal layer on the second barrier metal layer.

2. The semiconductor device package of claim 1, wherein a contact area between the sputtered die attach material layer and the die attach region of the package substrate is greater than about one square millimeter.

3. The semiconductor device package of claim 1, wherein the die attach material layer comprises a eutectic or near eutectic alloy, and further comprising an alloy of the die attach material layer and the metal interlayer along an interface therebetween.

4. The semiconductor device package of claim 3, wherein the metal interlayer comprises at least one of nickel (Ni), silver (Ag), palladium (Pd), or copper (Cu).

5. The semiconductor device package of claim 1, wherein the die attach material layer comprises gold (Au), and wherein the package substrate comprises copper (Cu).

6. The semiconductor device package of claim 1, further comprising:
at least one contact on the semiconductor device layer opposite the SiC substrate; and
at least one via extending through the SiC substrate from the second surface thereof toward the at least one contact, wherein the die attach metal stack and the contact metal stack conformally extend along the second surface of the SiC substrate and within the via along sidewall surfaces thereof such that the via is unfilled.

7. A semiconductor device package, comprising:
a package substrate comprising a die attach region;
a silicon carbide (SiC) substrate having a first surface including a semiconductor device layer thereon and a second surface that is opposite the first surface; and
a die attach metal stack that attaches the second surface of the SiC substrate to the die attach region of the package substrate, the die attach metal stack comprising a first barrier metal layer, a die attach material layer, a metal interlayer that is between the first barrier metal layer and the die attach material layer, and an adhesion layer that is between the first barrier metal layer and the second surface of the SiC substrate.

8. The semiconductor device package of claim 7, wherein the die attach material layer comprises a eutectic or near eutectic alloy, and further comprising an alloy of the die attach material layer and the metal interlayer along an interface therebetween.

9. The semiconductor device package of claim 8, wherein the metal interlayer comprises at least one of nickel (Ni), silver (Ag), palladium (Pd), or copper (Cu).

10. The semiconductor device package of claim 7, wherein the die attach material layer comprises a sputtered layer having a void percent of about 15 or less, and wherein a contact area between the die attach material layer and the die attach region of the package substrate is greater than about one square millimeter.

11. The semiconductor device package of claim 10, wherein the die attach material comprise gold (Au) or alloy thereof, and wherein the package substrate comprises copper (Cu).

12. The semiconductor device package of claim 7, wherein the adhesion layer is a first adhesion layer, and further comprising:
a contact metal stack between the die attach metal stack and the second surface of the SiC substrate, the contact metal stack comprising a second adhesion layer on the second surface of the SiC substrate, a second barrier metal layer on the second adhesion layer, and a contact metal layer on the second barrier metal layer.

13. The semiconductor device package of claim 12, wherein the first adhesion layer and/or the second adhesion layer comprises titanium (Ti) or alloy thereof, wherein the second barrier metal layer comprises Ti and/or tungsten (W) or alloys thereof, wherein the contact metal layer comprises Au or alloy thereof, and wherein a thickness of the contact metal layer is greater than a thickness of the die attach material layer.

14. The semiconductor device package of claim 12, further comprising:
at least one contact on the semiconductor device layer opposite the SiC substrate; and
at least one via extending through the SiC substrate from the second surface thereof toward the at least one contact, wherein the die attach metal stack and the contact metal stack conformally extend along the second surface of the SiC substrate and within the via along sidewall surfaces thereof such that the via is unfilled.

15. A semiconductor device package, comprising:
a package substrate comprising a die attach region;
a silicon carbide (SiC) substrate having a first surface including a semiconductor device layer thereon and a second surface that is opposite the first surface;
a die attach metal stack that attaches the second surface of the SiC substrate to the die attach region of the package substrate, the die attach metal stack comprising a first barrier metal layer, a die attach material layer, a metal interlayer that is between the first barrier metal layer and the die attach material layer and is configured to react with the die attach material layer during a phase transition thereof, and a first adhesion layer between the first barrier metal layer and the second surface of the SiC substrate; and
a contact metal stack between the die attach metal stack and the second surface of the SiC substrate, the contact metal stack comprising a second adhesion layer on the second surface of the SiC substrate, a second barrier metal layer on the second adhesion layer, and a contact metal layer on the second barrier metal layer.

16. The semiconductor device package of claim 15, wherein the second adhesion layer comprises titanium (Ti) or alloy thereof, wherein the second barrier metal layer comprises Ti and/or tungsten (W) or alloys thereof, wherein the contact metal layer comprises Au or alloy thereof, and wherein a thickness of the contact metal layer is greater than a thickness of the die attach material layer.

17. The semiconductor device package of claim 15, further comprising:
at least one contact on the semiconductor device layer opposite the SiC substrate; and
at least one via extending through the SiC substrate from the second surface thereof toward the at least one contact, wherein the contact metal stack and the die attach metal stack conformally extend from the second surface of the SiC substrate and within the via along sidewall surfaces thereof such that the via is unfilled.

* * * * *

UNITED STATES PATENT AND TRADEMARK OFFICE
CERTIFICATE OF CORRECTION

| | |
|---|---|
| PATENT NO. | : 11,152,325 B2 |
| APPLICATION NO. | : 16/548241 |
| DATED | : October 19, 2021 |
| INVENTOR(S) | : Komposch et al. |

It is certified that error appears in the above-identified patent and that said Letters Patent is hereby corrected as shown below:

In the Specification

Column 9, Line 48: Please correct "2% Sn" to read -- 20% Sn --

Signed and Sealed this
Twenty-second Day of March, 2022

Drew Hirshfeld
*Performing the Functions and Duties of the
Under Secretary of Commerce for Intellectual Property and
Director of the United States Patent and Trademark Office*